United States Patent
Deutsch et al.

(10) Patent No.: US 8,035,409 B2
(45) Date of Patent: Oct. 11, 2011

(54) SYSTEM AND METHOD IMPLEMENTING SHORT-PULSE PROPAGATION TECHNIQUE ON PRODUCTION-LEVEL BOARDS WITH INCREMENTAL ACCURACY AND PRODUCTIVITY LEVELS

(75) Inventors: Alina Deutsch, Yorktown Heights, NY (US); George A. Katopis, Poughkeepsie, NY (US); Gerard V. Kopcsay, Yorktown Heights, NY (US); Roger S. Krabbenhoft, Rochester, MN (US); Christopher W. Surovic, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 12/432,082

(22) Filed: Apr. 29, 2009

(65) Prior Publication Data

US 2010/0277197 A1    Nov. 4, 2010

(51) Int. Cl.
*G01R 31/304* (2006.01)
*G01R 31/306* (2006.01)
*G01R 31/309* (2006.01)
*G06F 11/30* (2006.01)

(52) U.S. Cl. .................... 324/763.01; 324/520; 702/182

(58) Field of Classification Search .................. 324/520, 324/512, 500, 757.02, 756.07, 537, 763.01, 324/555; 702/182, 127

See application file for complete search history.

(56) References Cited

U.S. PATENT DOCUMENTS

| | | | | |
|---|---|---|---|---|
| 6,501,278 | B1 * | 12/2002 | Arabi | 324/533 |
| 6,867,579 | B2 * | 3/2005 | Seppala et al. | 324/757.02 |
| 7,047,515 | B1 * | 5/2006 | Vitek et al. | 716/115 |
| 7,242,210 | B2 * | 7/2007 | Koizumi | 324/763.01 |
| 7,250,781 | B2 * | 7/2007 | Nakagawa et al. | 324/756.05 |
| 7,631,230 | B2 * | 12/2009 | Williams | 714/712 |
| 2004/0145376 | A1 * | 7/2004 | Sam | 324/642 |

OTHER PUBLICATIONS

A. Deutsch, et al.,"Practical Considerations in the Modeling and Characterization of Printed-Circuit Board Wiring", Digest of SPI'06, Signal Propagation on Interconnects, May 10-13, 2006, Berlin, pp. 1-4.

Winkel, et al., "Comparison of Time- and Frequency-Domain Measurement Results for Product Related Card and MCM Transmission Lines up to 65 GHz", Proc. Dig. IEEE 14th Top. Mtg Elec. Perf. of Electronic Packaging, Austin, TX, Oct. 24-26, 2005, pp. 21-24.

Weeks, "Calculation of coefficients of capacitance of multiconductor transmission lines in the presence of dielectric interface", IEEE Trans. Mirowave Theory Tech., vol. MTT-18, pp. 35-43, 1970.

Deutsch, et al., "Extraction of er(f) and tand(f) for Printed Circuit Board Insulators Up to 30 GHz Using the Short-Pulse Propagation Technique", IEEE Transactions on Advanced packaging, vol. 28, No. 1, pp. 4-12, Feb. 2005.

(Continued)

*Primary Examiner* — Hoai-An D Nguyen
(74) *Attorney, Agent, or Firm* — Scully, Scott, Murphy & Presser, P.C.; Daniel P. Morris, Esq.

(57) ABSTRACT

A system and method for performing a test for characterizing high frequency operation of PCB boards. More particularly, a system and methodology is provided to implement a time-domain short pulse propagation (SPP) technique on the production line, on large, multi-layer, product-level PCB boards, for large volume testing, by people who are not familiar with advanced, delicate, measurement techniques, who need robust test facilities, and cannot afford the time or expense of other lab-type approaches.

25 Claims, 14 Drawing Sheets

OTHER PUBLICATIONS

Deutsch, et al., "Prediction of Losses Caused by Roughness of Metallization in Printed-Circuit Boards", IEEE Transactions on Advanced Packaging, vol. 30, No. 2, May 2007.

Deutsch, et al., "Use of the SPP Technique to Account for Inhomogeneities in Differential Printed-Circuit-Board Wiring" Digest of SPI'08, Signal Propagation on Interconnects, May 12-15, 2008, Avignon, France, pp. 22-26.

* cited by examiner

SYSTEM AND METHOD IMPLEMENTING SHORT-PULSE PROPAGATION TECHNIQUE ON PRODUCTION-LEVEL BOARDS WITH INCREMENTAL ACCURACY AND PRODUCTIVITY LEVELS

BACKGROUND OF THE INVENTION

1. Field of the Invention

The present invention relates generally to systems and techniques for modeling and characterizing printed-circuit board wiring, and particularly, to an improved system and method for generating more accurate transmission line models and characterizations for predicting performance of circuits and circuit structures as printed-circuit board transmission data-rates increase.

2. Description of the Prior Art

There currently exists limited techniques for providing time and frequency domain measurements from which transmission line models and material parameters for characterizing high frequency performance of printed-circuit board (PCB) conductor structures (i.e., transmission lines) may be extracted.

One particular technique, known in the art as short-pulse-propagation, SPP, is a time-domain technique that may be employed to model and characterize performance of circuits and circuit structures. As described in the reference to A. Deutsch, R. S. Krabbenhoft, et al. entitled "Practical Considerations in the Modeling and Characterization of Printed-Circuit Board Wiring", Digest of SPI'06, Signal Propagation on Interconnects, May 10-13, 2006, Berlin, pp. 1-4, incorporated by reference herein, the SPP technique requires propagating a short, electrical pulse along two identical transmission lines with different lengths, $l_1$ and $l_2$. In current practice, the short pulse is generated by differentiating the step-source of a sampling oscilloscope.

FIG. 1 depicts an exemplary prior art measurement apparatus 10 for characterizing high frequency performance of a non-production level (test) PCB showing a short pulse generating source 12 feeding test pulse signals to coaxial probes 16 for differential measurement. The prior art set-up depicted in FIG. 1 is a bench-test set-up configured to conduct a time domain transmission (TDT) measurement technique by launching a short, electrical pulse onto a transmission-line structure on the PCB and measuring the pulse signals to compute characterizing data. In one embodiment, using the test set-up 10 shown in FIG. 1, the test pulse signals are obtained by differentiating the step-source of a sampling oscilloscope 12 (e.g., an HP model 54120A) using a passive impulse-forming network 17. In one embodiment, source pulses are, for example, 35 ps and 29 ps (obtained with the Picosecond Pulse Labs pulse generator 4015C and the 5208 network) width and are launched on respective transmission-line structures of different line lengths via test pads formed on the surface of the PCB. High-speed coaxial probes 16 in ground-signal (GS) configuration, (GGB Industries model 40A, 15OLP) are used to connect to the transmission-lines via test pads. In FIG. 1, a 50-GHz sampling oscilloscope 12 uses a detector channel, e.g., with 2.4 mm connectors and 40 GHz flexible coaxial cables 19 (e.g., Gore GD/AJ, 160-mil-diameter) between the probes 16 and the oscilloscope 15.

Although not shown in FIG. 1, the test set-up 10 is further configured to provide at the PCB a parallel-plate device by which a low-frequency capacitance measurement may be made by a low frequency impedance analyzer. More particularly, according to the prior art, the line self and mutual capacitances are able to be measured and modeled, e.g., at 1 MHz as is the effective dielectric constant of region around the lines.

In accordance with the SPP technique using the apparatus depicted in FIG. 1, the transmitted pulses are detected and digitized. A time window technique is applied to the pulses to eliminate unwanted reflections from the measurement probes, any contact pads and vias, and cable connectors. In exemplary embodiments, a rectangular time window is used with a smooth transition to the signal baseline steady-state level since the amplitude resolution is more essential than the spectral resolution for this technique. A Fast Fourier Transform (FFT) is performed on the processed waveforms to obtain the complex propagation constant $\Gamma(f)$ set forth in equation (1):

$$\Gamma(f) = \alpha(f) + j\beta(f) = \frac{1}{l_1 - l_2}\ln\left(\frac{A_1(f)}{A_2(f)}\right) + j\frac{\Phi_1(f) - \Phi_2(f)}{l_1 - l_2} \quad (1)$$

where $\alpha(f)$ and $\beta(f)$ are the attenuation and phase constant, respectively, of the transmission line as a function of frequency (f), and, $A_i(f)$ and $\Phi_i(f)$ are the respective amplitude and the phase of the transforms corresponding to the lines with lengths of $l_1$ and $l_2$ and $l_1 > l_2$. As referred to herein, frequency is referred to as a variable "f" or "ω".

From the ratio of the two Fourier transforms, the broadband attenuation and phase constant is extracted. No de-embedding or calibration is needed as in frequency-domain based techniques using Vector-Network Analyzers, VNA. The per-unit-length R(f), L(f), C(f), G(f) parameters (R is resistance, L is inductance, C is capacitance, and G is conductance) for the transmission line structure are then calculated using the dimensions obtained by cross sectioning the PCB hardware. This calculation is performed by using an (electromagnetic) field solver that also requires the metal resistivity information of the T-line structures. This metal resistivity information is obtained in accordance with equation (2) by performing a four-point resistance measurement of the two lines and using the actual dimensions, $$R = \frac{\rho l}{A} \quad (2)$$

where R is the resistance of the conductor and p is the resistivity, l is the length and A the cross-sectional area of the T-line conductor.

The initial calculation of the per-unit-length R(f), L(f), C(f), G(f) parameters for the transmission line structure is performed with an initial estimation of dielectric constant and dielectric loss. For the low frequency range of 10 KHz to 1 MHz, actual measurements of dielectric loss can be made on a large parallel plate structure embedded on the same PCB structure with the signal layer of interest.

The dielectric constant "∈" at 1 MHz can be reliably measured from the capacitance measurement on the parallel plate structure of the PCB in accordance with equation (3):

$$C = \frac{\varepsilon_0 \varepsilon_r A}{h} \quad (3)$$

where C is the capacitance, $\in_r$ the relative permittivity, $\in_o$ the absolute permittivity, A the plate area, and h is the thickness of the dielectric. In current practice, for the signal transmission frequency range between 1 GHz to 50 GHz, an initial guess is made. An electromagnetic field solver is implemented to fit a range of values for the complex permittivity using this initial guess. The attenuation and phase are then calculated based on the R, L, C, G values. The calculated and measured values are compared, and, the procedure is repeated until good agreement is obtained. Each time, the dielectric loss is changed.

The field solver generates causal results for C(f) and G(f) based on a Debye model for the complex permittivity:

$$\varepsilon(\omega) = \varepsilon_\infty + \sum_i \frac{\varepsilon_i}{1 + j\omega\tau_i} \quad (4)$$

where $\varepsilon_i$, $\varepsilon_\infty$ and $\tau_i$ are parameters or the expansion in accordance with the Debye model.

The final C(f) and G(f) are used, together with the measured $\varepsilon_r$ and the calculated C at 1 MHz, to obtain a measure of the broadband complex permittivity in accordance with equations (5).

$$\varepsilon_r(\omega) = \left(\frac{C(\omega)}{C_{1\ MHz}}\right) \times \varepsilon_{r1\ MHz} \quad (5)$$

$$\tan\delta(\omega) = \frac{G(\omega)}{\omega C(\omega)}$$

where $\omega$ is the frequency and tan $\delta$ a measure of dielectric loss.

The broadband characteristic impedance $Z_o$ is now obtained from equation (6):

$$Z_0 = \frac{\Gamma(\omega)}{G(\omega) + j\omega C(\omega)} \quad (6)$$

It is the case that typical VNA based measurements can generally obtain attenuation and phase, especially for high frequency range, but $Z_o(f)$ cannot be extracted due to the large discontinuities found in realistic multi-layer printed-circuit-boards, PCBs. As was demonstrated in the reference to T-M. Winkel, et al., entitled, "Comparison of Time- and Frequency-Domain Measurement Results for Product Related Card and MCM Transmission Lines up to 65 GHz", Proc. Dig. IEEE 14th Top. Mtg Elec. Perf. of Electronic Packaging, Austin, Tex., Oct. 24-26, 2005, pp. 21-24, the current de-embedding and calibration techniques cannot compensate for the large end effects, i.e., the capacitance, resistance, inductance of the via, test pads, and probes.

As data rates transmitted on printed-circuit-boards increase from 2 Gbps to 20 Gbps and beyond, there is required more accurate and causal transmission line models for predicting system performance. Non-causal models can cause inaccurate signal integrity and timing prediction and simulator convergence problem. In order to generate broadband causal models (DC to ~50 GHz) there is needed higher accuracy and higher-bandwidth measurements of dielectric constant $\varepsilon_r(f)$ and dielectric loss tan $\delta(f)$. Single value $\varepsilon_r$ and tan $\delta$ that are typically supplied by vendors cannot generate causal models. The current practice for monitoring the integrity of production level printed-circuit boards is to measure the $Z_o$ obtained from TDR measurements using a single, hand-held probe. One such prior art probe for TDR measurements is a hand-held probe 80 provided by Polar Instruments Ltd. (Beaverton Oreg.) such as depicted in FIG. 8A with its cover removed. In this embodiment, a Polar generated step source for conducting the TDR measurement has an approximate 120 ps-200 ps rise-time. Additionally, a 10 mil pitch coaxial probe 85 additionally shown in FIG. 7A can also be used for high-speed measurements as these types of coaxial probes may generate 1 ps-35 ps transitions. Further, the hand-held probes 80 include the probe tips 87 depicted in FIG. 7B with a 100 mil pitch as shown in close-up view.

Thus, currently, $\varepsilon_r$ and tan $\delta$ values are generally supplied only at a few frequencies and measured on simple, non-representative structures. However, it is the case that such measurements are required to be made on multi-layer configurations and the data is needed over a wide frequency range such as from DC to 50 GHz. In addition, as higher-performance systems need the development of lower loss materials, these new materials need to be analyzed in representative, multi-layer structures. Furthermore, concerns to be considered such as losses due to roughness that could become significant, in the order of 5-50% loss increase at 5 GHz, for example. Further considerations to be accounted for include: moisture absorption of new materials that impacts reliability. Further, lead-free compatibility imposes manufacturing constraints that impact electrical characteristics.

Moreover, simple TDR production-level $Z_o$ process monitors need to be improved because such techniques overpredict $Z_o$ due to losses on the board wiring. Overprediction of $Z_o$ affects board design, cost, wireability, and system power. Thus, $Z_o$ extraction needs to be extended to broadband phase constant $\Gamma(f)$ and broadband characteristic impedance $Z_o(f)$.

It would be highly desirable to provide an improved test apparatus that can extend this measurement capability to multi-layer production level PCB boards by providing at least two lines of different lengths and utilizing better probes, improved structures, and instrumentation.

It is desired that such improved testability further maintain the ruggedness commensurate with production level testing.

SUMMARY OF THE INVENTION

The present invention is directed to a system and methodology that incorporates advanced measurement techniques for extracting electrical characteristics of interconnects on multi-layer production level printed circuit boards.

Bringing such test capability into the production environment is currently unique to this methodology which includes incorporating, on large multi-layer production level PCB boards, a simple structure that includes the lines of different lengths. Only a minimum of two such lines are needed. For full characterization, a large circular plate is also added to the large multi-layer production level PCB board.

According to an aspect of the present invention, there is provided a system and method of testing a multi-level printed circuit board (PCB) having one or more layers of conductors carrying signals at or exceeding Gigahertz frequencies. The testing method comprises:

providing, at a layer of the multi-level PCB board, a test structure comprising:
  a first conductor line, of x length and a second conductor line formed at a same layer of y length where x>y; and, each first and second conductor line having respective capture pad termination at each end; and,
  a plated via through hole extending between a formed surface test pad connector at a surface of the PCB for electrically coupling respective first and second capture pad terminations at each line end to a respective surface test pad connector provided at a PCB surface, each test pad connector configured for electrical coupling to an RF connector device at the PCB board surface, automatically coupling a first RF connector device to a respective surface test pad connector via an RF connector device at a first end of a conductor line and a second RF connector device to a respective surface test pad connector at a second end a conductor line;

automatically configuring a testing apparatus for testing the conductor line formed at the layer by inputting signals at a first end of the conducting line via the first RF connector device coupled to a first surface test pad connector at a PCB surface and, measuring signals at a second end of the conducting line via the second RF connector device coupled to a second surface test pad connector at the PCB surface, the testing implementing a time-domain Short Pulse Propagation (SPP) technique; and, processing, at a computing device, the measured signals for modeling performance of the PCB when operating in excess of Gigahertz frequencies.

Further to this aspect of the invention, the testing apparatus comprises first and second mounting devices rigidly holding the first and second RF connector devices, a platform for engaging the multi-level PCB, and an indexing means carrying for automatically aligning the platform carrying the multi-level PCB with the first and second RF connector devices and automatically coupling the first and second RF connector devices to respective first and second surface test pad structures.

Alternatively, the testing apparatus comprises first and second robotic manipulator arms holding respective the first and second RF connector devices, the method further comprising: automatically coupling the first and second RF connector devices held by the robotic arms to respective surface test pad structures of the multi-level PCB.

In a further aspect of the invention, a portion of the plated via through hole extending between a formed surface test pad connector at one of a top or bottom PCB surface and a conductor line capture pad at a signal line layer beneath the PCB surface includes a stub portion, the test method further comprising:

during the testing, coupling the RF connector devices to a surface test pad connector that minimizes a length of the stub portion.

In one embodiment, the PCB is a production-level PCB, the computing device processing the measured signals for extracting a broadband propagation constant and characteristic impedance of the conductor line structures useful for the performance modeling.

In one embodiment, the PCB is a production-level PCB, the computing device processing said measured signals for extracting a broadband attenuation and phase constant of said conductor line structures useful for said performance modeling.

According to another aspect of the invention, there is provided a test structure for facilitating performance testing of a multi-level printed circuit board (PCB) having one or more layers of conductors carrying signals at or exceeding Gigahertz frequencies, the testing structure comprises:

a first conductor line formed at a layer of the multi-level PCB board, of x length and a second conductor line formed at a same layer of the multi-level PCB board, of y length where x>y; and, each first and second conductor line having respective capture pad termination at each end; and, a plated via through hole extending between a formed surface test pad connector at a surface of the PCB for electrically coupling respective first and second capture pad terminations at each line end to a respective surface test pad connector provided at a PCB surface, each test pad connector configured for electrical coupling to an RF connector device at the PCB board surface, wherein a test apparatus models performance of the PCB when operating in excess of Gigahertz frequencies by coupling signals to and from a conductor line via the RF connector device and automatically performing a time domain single pulse propagation measurement of the conductor lines at a PCB layer.

The test structure further comprises: formed at the same layer of the multi-level PCB board, a capacitor structure having corresponding surface test pad structure being electrically coupled to the capacitor structure through a respective plated via through hole and configured for electrical coupling to the RF connector device.

In one embodiment, the plated via through hole extends between front and back PCB surfaces, a test pad connector provided at both front and back PCB board surfaces.

Further, the first and second conducting lines are each formed at multiple layers of a PCB, each conductor line at each layer having a respectively formed PTH via connection to a respective test pad connector formed at a PCB surface.

Further, a portion of the plated via through hole extending between a formed surface test pad connector at one of a top or bottom PCB surface and a conductor line capture pad at a signal line layer beneath the PCB surface includes a stub portion, wherein, during the testing, the RF connector devices coupled to a surface test pad connector that minimizes a length of the stub portion.

According to a further aspect of the invention, there is provided a method of forming a test structure for a multi-level printed circuit board (PCB) having one or more layers of conductors carrying signals at or exceeding Gigahertz frequencies, the method comprising:

forming at a layer of the PCB board, a first conductor line of x length and a second conductor line of y length where x>y; and, each first and second conductor line having respective capture pad termination at each end;

forming, at each top and bottom PCB surface, a respective surface test pad connector structure in alignment with a corresponding capture pad termination at each conductor line end, and configured for electrical coupling to an RF connector device at the PCB board surface;

forming a respective via through hole extending between a formed surface test pad connector at the top and bottom surfaces of the PCB, the formed via hole intersecting a respective capture pad termination of each the conductor line; and, plating the via through hole for electrically coupling a respective first and second capture pad termination of a conductor line to a respective surface test pad connector.

Advantageously, the system and method of the present invention enables testing of PCBs in a production level environment. In such environments, very thick boards are tested with very long plated through-hole (PTH) vias. Testing may be performed on many boards within short time by operators who are not familiar with advanced, delicate measurement technique. The set-up is automated or semi-automated for large volume, fast testing and robust for rough handling.

BRIEF DESCRIPTION OF THE FIGURES

The features and advantages of the present invention will become apparent to one skilled in the art, in view of the following detailed description taken in combination with the attached drawings, in which.

DETAILED DESCRIPTION OF THE PREFERRED EMBODIMENTS

A preferred embodiment of the invention consisting of a description of the method employed and the necessary apparatus will now be described.

In one embodiment, a system and methodology of incorporating advanced measurement techniques for extracting electrical characteristics of interconnects on multi-layer production level printed circuit boards is provided. Bringing such test capability into the production environment is unique to this methodology.

Figure 8:
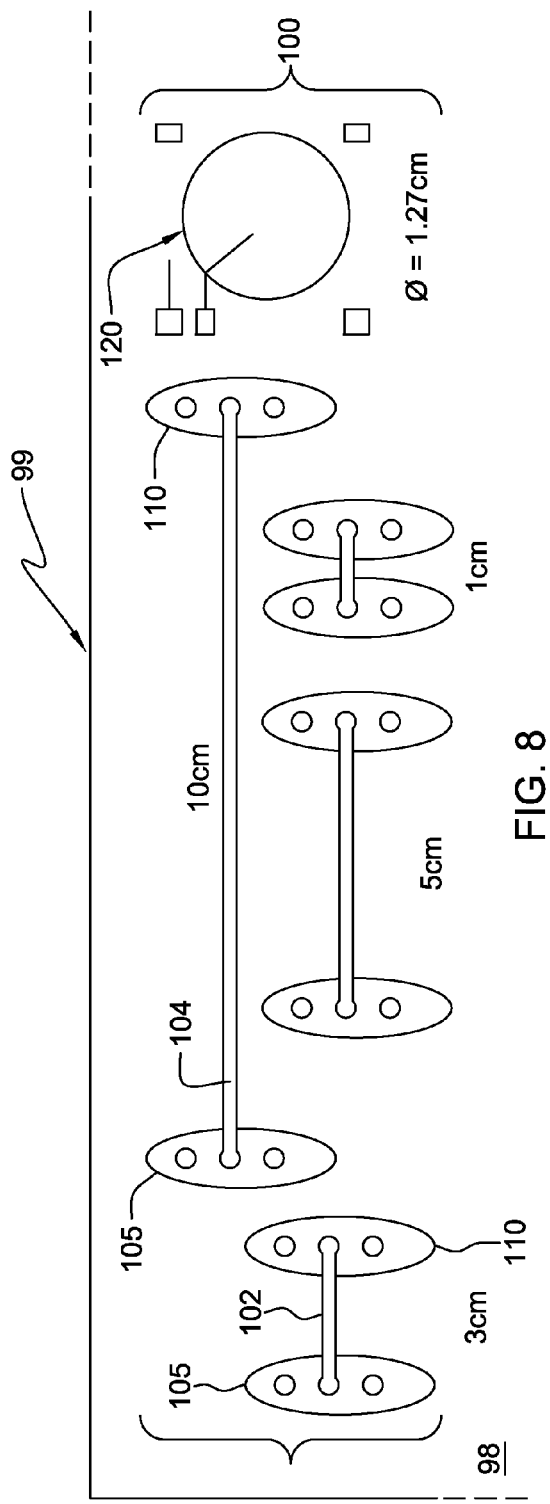
FIG. 8 is in top view of a test coupon structure having various line lengths and parallel plate structure according to one embodiment of the invention.

FIG. 8 depicts a top view of a portion of a large production level PCB board 99. In an example embodiment, the PCB board in FIG. 8 is a large functional board, e.g., about ⅕ to ¼ inches thick and about 20 in. by 14 in. in area, for example, and may comprise a blend of glass fiber weave and epoxy-resin (e.g., bismaleimide triazine (BT)) as a substrate for use in printed circuit board wiring. According to the invention, the production board 99 is manufactured to include a test coupon 100 of small footprint including two or more conducting line structures, each line of different lengths manufactured on the PCB surface 98. For example, the coupon size may be about 2.54 cm×16 cm having at least two such conducting lines 102, 104 of 3 cm and 10 cm in length, respectively. As shown in the top view of the PCB of FIG. 8, the coupon may include additional line structures formed of alternate lengths, e.g., 1 cm, 5 cm, etc. Conductor line materials typically include Cu, however, may include other conductive materials, e.g., alloys of copper. Conductor lines may include transmission lines (T-line) including microstrip and stripline structures capable of carrying digital signals at Gigahertz frequencies. For fill characterization, the coupon structure 100 includes a capacitor structure, e.g. plate 120 having the PCB substrate material as a dielectric. In one embodiment, the capacitor 120 includes a plate structure of a diameter between 50×-100× the height of insulator, e.g., 500-mil in diameter, having probe contacts, such that, a capacitive measurement may be performed at relatively low frequency, e.g., to calculate the dielectric constant. In one embodiment, the capacitor plate structure depicted in FIG. 8 is used for extracting dielectric constant at a frequency of 1 MHz, for example.

The insulator between the plate 120 and the ground planes above and below the signal layer is the same as the dielectric with glass fiber composition found around the signal conductors of the stripline. Example dielectric constants at 1 MHz are in the range of 3 to 5. The diameter of the plate is 50-100× the height between the plate and the ground plane. This height is in the range of 3 to 5 mil. The signal line widths are in the range of 3 to 5 mil with thickness of 0.7 to 1.4 mil. FIG. 8 also shows the connection to the ground planes and dummy structures that duplicate the connection to the plate but without the plate present. Both the plate and the dummy structure capacitances are measured and the final capacitance value calculated according to equation (3) is the difference between these two measurements.

As further shown in FIG. 8, each line 102, 104 of the coupon 100 includes a respective surface test pad 105, 110 at each respective conductor line end for accommodating an RF/microwave frequency contact used for bandwidth applications (up to ~50 GHz) as test probes. In accordance with one embodiment of the invention, the testing structure implements high performance SMA-type connectors, however, it is understood that other connectors of coaxial probes can be used. In one example, with a step excitation, the SMA probe can transmit a pulse in the production environment.

Figure 9A:
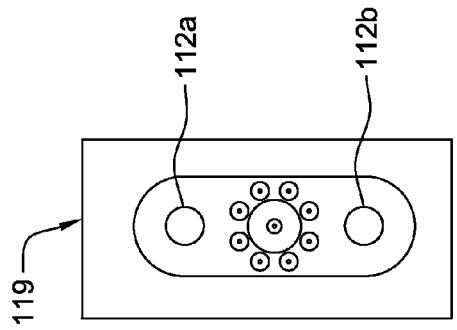
FIG. 9A shows an enlarged close-up view of an example top view of a test pad structure for connecting to an RF connector device formed at the top surface of the PCB; and, FIG. 9B shows an enlarged close-up view of an example bottom view of the test pad structure of FIG. 9A, formed at the bottom surface of the PCB.
Figure 9B:
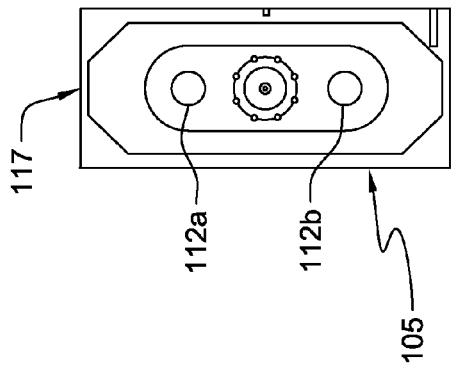
Figure 10:
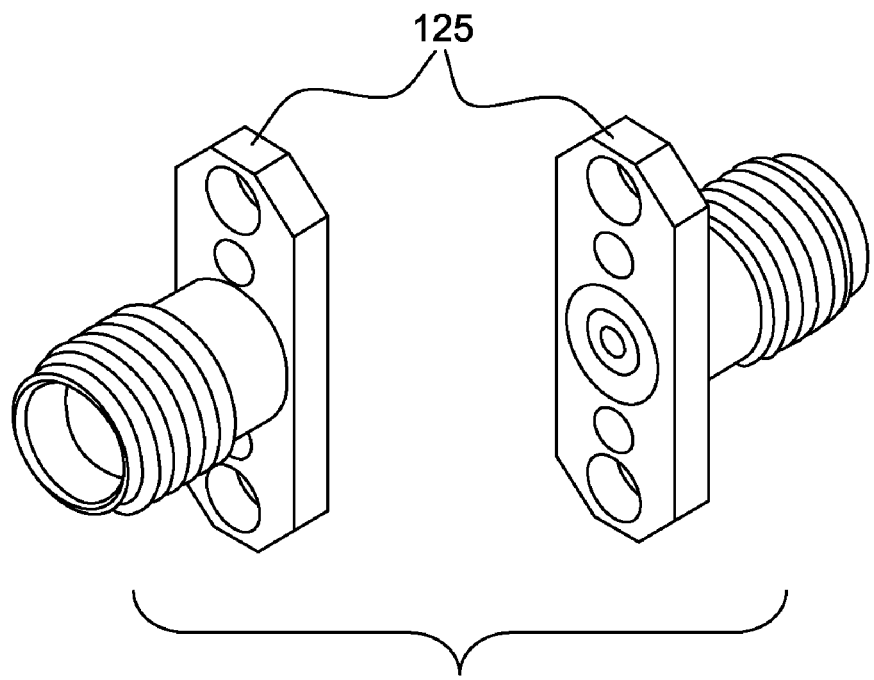
FIG. 10 shows a typical SMA connector in both front and back perspective views.

FIG. 9 shows enlarged close-up views of an example test pad structure 105 connecting a conductor or T-line formed in a test coupon 100 of FIG. 8 and particularly, a single test pad structure 117 shown at a top view of the PCB board (shown in FIG. 9A) and a test pad structure 119 shown at a bottom view of the PCB board (shown in FIG. 9B). In one embodiment, for example, each SMA connector test pad 105, 110 includes alignment holes 112a, b, for mating with an SMA connector such as SMA connectors 125 shown in both front and back perspective views as depicted in FIG. 10. The test pad 105, 110 alignment holes, in one embodiment, may be dimensioned as 1.575 mm [0.062 in] in diameter on, for example, a 6.99 mm [0.275 in] pitch, for accommodating mating of an SMA connector 125.

Figure 11:
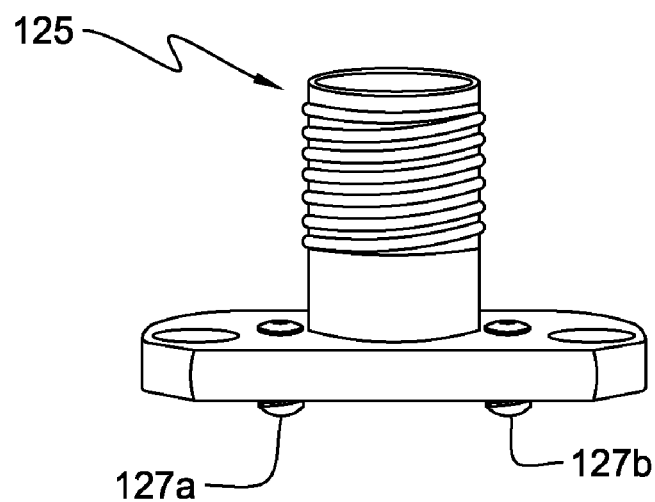
FIG. 11 depicts a side view of an SMA connector showing alignment screws/posts inserted into the SMA connector at respective alignment holes for mating an SMA connector with a test pad provided at each end of the conductor line.

As shown in FIG. 11, for testing/measurement, a pair of set screws or other threaded posts 127a, 127b are inserted into the SMA connector 125 at each respective alignment hole 112a, 112b in order to mate a respective SMA connector with the test pad 105, 110 provided at each end of the conductor line. In the embodiment depicted in FIG. 11, a set screw/post that is inserted into the SMA may be dimensioned as 3.175 mm [0.125 in.] in length and 1.473 mm [0.058 in.] in diameter. Thus, in the embodiment depicted in FIG. 11, the set screws/posts may extend beyond, e.g., protrude 0.89 mm [0.035 in] below the surface of the SMA connector and function as mechanical alignment pins that can be slip-fit into the holes 112a, 112b in the card shown in the example test set-up shown in FIG. 12 and enable the SMA to function as a probe, rather than as a bolted permanent SMA connection.

Figure 12:
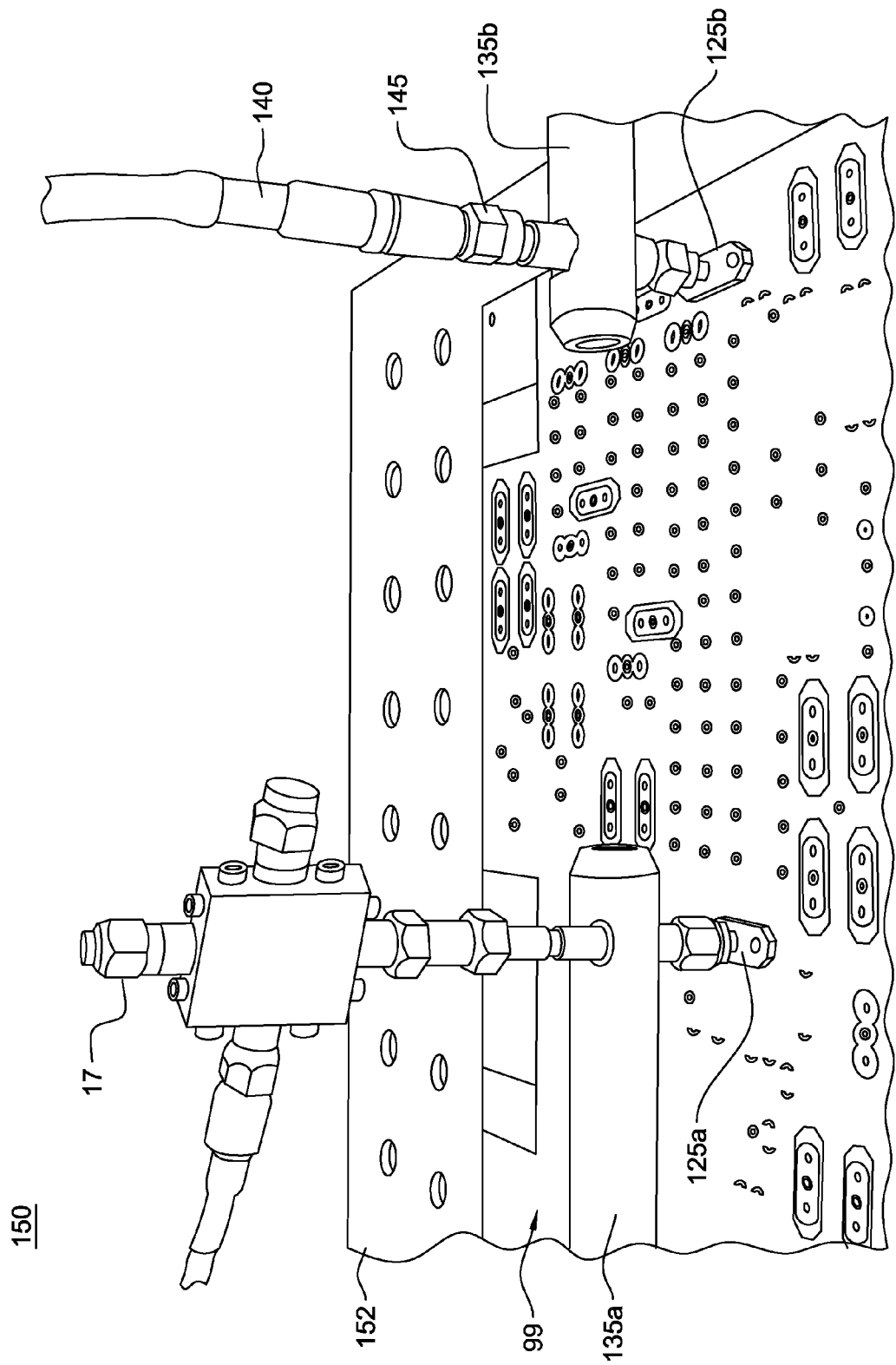
FIG. 12 illustrates a production level test set-up depicting a semi-permanent attachment of surface-mount SMA connector functioning as a probe that can easily be mounted and dismounted onto a respective surface test pad according to one aspect of the present invention.

FIG. 12 particularly illustrates an example test fixture 150 including a semi-permanent attachment of two surface-mount SMA connectors 125a, 125b that can be mounted and dismounted onto a respective test pad 105, 110. In one embodiment, the mounting and dismounting may be automated, e.g., performed by lowering or raising the height of a holding base or platform 152 upon which the PCB board 99 under test is mounted. That is, in one embodiment, during a PCB production level test run, an indexing mechanism (not shown) is provided for lifting the board 99 into position, and the respective SMA connectors 125a, 125b, which are each rigidly held by a respective mounting arm 135a, 135b in spaced apart relation (e.g., 3 cm or 10 cm) to accommodate the particular T-line line lengths of the coupon, is inserted into the holes with the set screws for surface mounting of the SMA connector 125 to a respective test pad. The SMA connectors 125a,b are themselves electrically coupled to test equipment by attaching RF cabling 140 to a coaxial adaptor 145 that mates with the mounted SMA connector.

It is understood that, in an alternative embodiment, the test fixture 150 may provide for the SMA connector to be mounted and dismounted onto a respective coupon test pad by automatically indexing (lowering or raising) a robotic arm holding the SMA connector itself until the held SMA connector itself mates to the test pad formed in the PCB board 99 test coupon. In one embodiment, the test fixture provides robotic/automated manipulators used to automatically place the probes along the surface of the large board. The manipulators are programmed to move along the large surface of the board to get to the correct position. Further, alternatively, the probe arm engaging the SMA connector may be manually indexed for mating the SMA connector within the respective test pad structure of a production level PCB, e.g., using a hand-held type probe (not shown).

Figure 13:
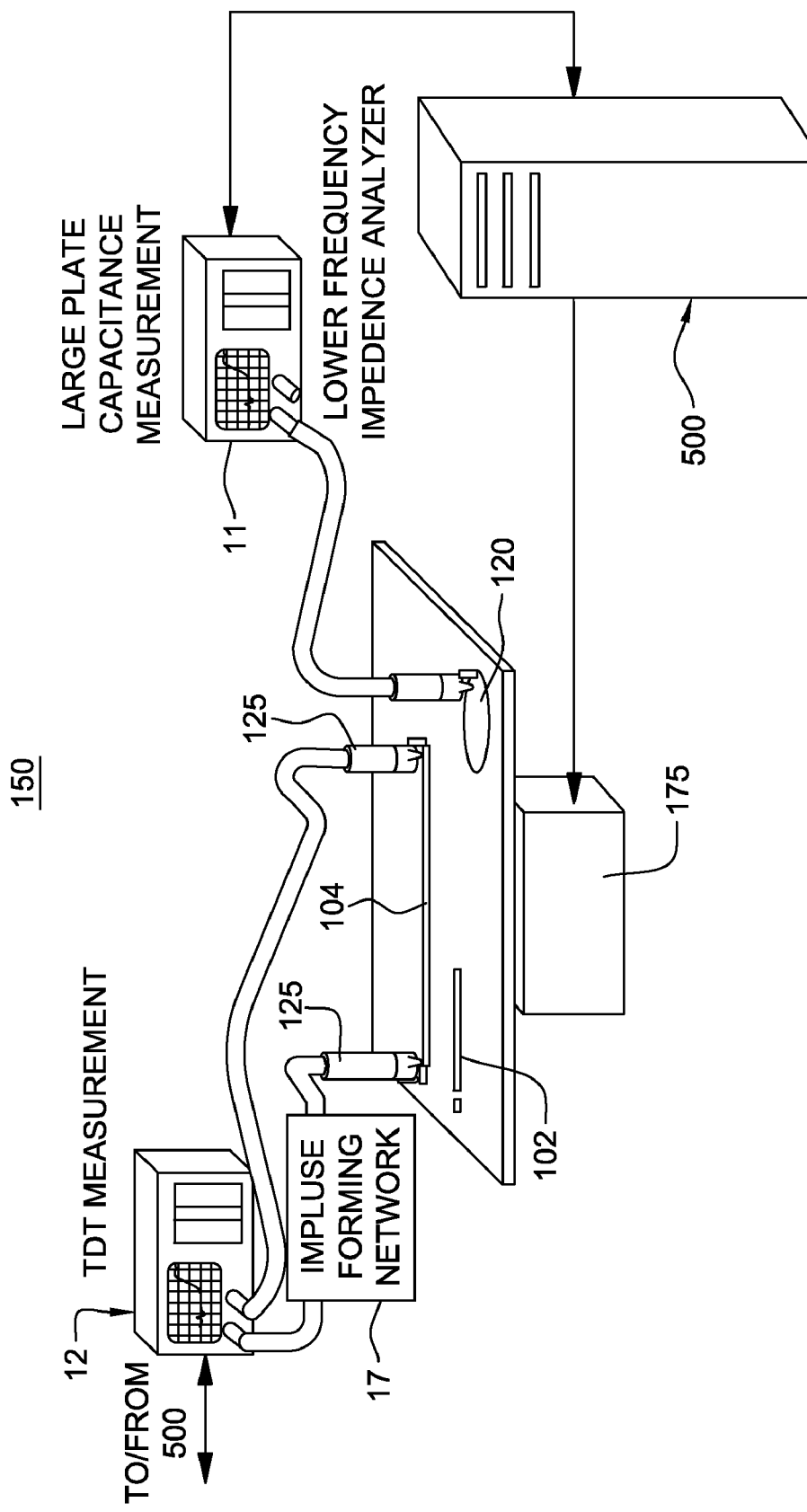
FIG. 13 illustrates conceptually an example production level test set up for automated SPP testing of production level PCB using a computer device programmed to implement the methodology depicted in FIG. 15 according to the invention.

FIG. 13 illustrates conceptually an example production level test set up for automated SPP testing of production level PCB. That is, the automated production-level testing implements computer device 500 for controlling both the 50-GHz sampling oscilloscope 12 for TDT measurements and a low frequency impedance analyzer 11 for capacitive measurements to perform the SPP production-level test methodology of the invention described in greater detail with respect to FIG. 15.

As mentioned herein above, a small portion of the PCB board space is for the coupon structures. In one embodiment, for a multi-level PCB having functional circuits on various levels, the conductor lines 102, 104 (or, like conductor "trace" structures) are formed on one or more specific layers. The same pattern is repeated for each layer and placed at various locations to check tolerances, which facilitate use of the coupon 100 that can be probed at the board surface to output data used in the SPP testing.

Figure 14:
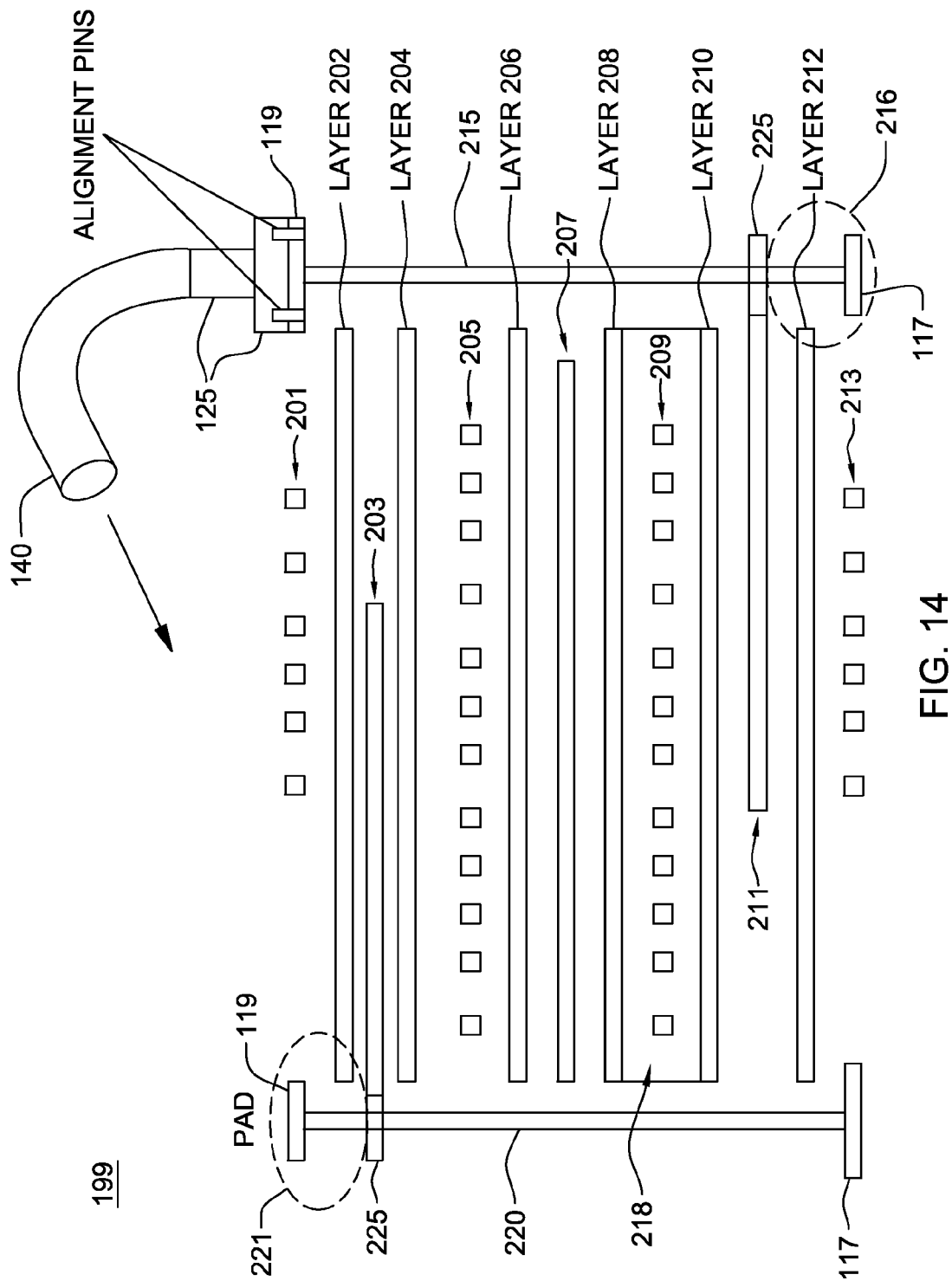
FIG. 14 is a diagram depicting a cross-sectional view of an example multi-level PCB board including the test coupon and PTH (plated through hole) vias for test measurements according to one aspect of the invention.

FIG. 14 is a diagram depicting a cross-sectional view of an example PCB board 199. In the embodiment of PCB 199 depicted, thirteen (13) levels (layers) 201-213 are provided with layers 201, 203, 205, 207, 209, 211 and 213 being electrical signal conducting layers and layers 202, 204, 206, 208, 210 and 212 being ground layers or ground planes. Signal conductor lines 201, 205, 209 and 213 are signal interconnects in the X-axis direction, for example, while, signal conductor lines 203, 207 and 211 are signal interconnects in the Y-axis direction, for example. It is understood that each of signal lines 201, 203, 205, 207, 209, 211 and 213 are formed in an insulator or substrate material, e.g., a dielectric material 218 such as BT. In one embodiment, the PCB insulator material comprises a composite(s) of a glass-fiber weave embedded in an epoxy resin. In a further aspect of the invention, one or more signal layers of the multi-level PCB 199 is manufactured to have the test site of FIG. 9 including the trace conductors (e.g., T-line structures) of 3 cm and 10 cm length and the capacitive plate structure. The test structure of lines and plate can be on any of the layers 201, 203, 205, 207, 209, 211, and 213. That is, the test site (coupon) 100 shown in FIG. 9 may be manufactured at one or more of the signal layers of the multi-level PCB. Each test site includes a respective manufactured via connection, such as via connections 215, 220 for contacting a top layer SMA test pad 119 or bottom layer SMA test pad 117 to both ends of a respective trace.

In one embodiment, each via connection 215, 220 is manufactured as a Plated Through Hole (PTH) connector, particularly, by drilling a respective via hole structure all the way through each layer of the PCB board through so as to contact a trace or specifically, a capture pad or similar metal feature formed at the end of a trace, and then plating the formed via hole with conductive material, e.g., a metal such as copper, to render it as a PTH. As shown in FIG. 14, each PTH via 215, 220 extends from layer 201 to layer 213 of PCB 199 and includes as is shown contacting a capture pad 225 connecting a signal line at each end (only 1 is shown) to the test pads 117, 119. More particularly, as shown in FIG. 14, a capture pad 225 is manufactured on the signal layer of interest. In the example PCB 199 depicted in FIG. 14, capture pads 225 are at the signal layer 203 and 211. During manufacture, the PCB board is drilled first, the drill preferably having an example tolerance such that the diameter of the capture pad placed on the signal layer is about three times (3×) the via diameter, to ensure that even if the drill shifts, it will land on a large capture pad 225. For example, in one embodiment, PTH via 215, 220 may be 12 mil in diameter while the capture pad diameter is 3× this value or more. Then, a conductor material, e.g., copper, is plated on the sides of the drilled via hole in order to make electrical contact from the top surface test pad to the signal line at the layer of interest.

As shown in FIG. 14, there is additionally provided via stub portions 216, 221 of the total PTH via length that extends beyond the layer in which the conductor line resides. The length of each respective via stub portions 216, 221 extending beyond signal layer is shown in broken circles. That is, stub portions 216, 221 are the PTH via length portions from the capture pad 225 at a layer of interest, such as 211 or 203, to the open end of PTH formed at the bottom surface of the PCB or such as layer 213 and pad 117, or formed at the top of the board on layer 201 and pad 119 when probing is done from test pad 117 and capture pad 225 is used for layer 203 signal.

As the bandwidth of the SPP technique implemented in accordance with the invention is dependent on the ability of eliminating the effect of end parasitics by using the time windowing and ratioing of FFTs, it has been found that the length of the plated-through hole (PTH) will have the strongest effect, i.e., the propagated pulses with various via stub conditions. Due to this effect, the back drilling of the vias 215, 220 is performed as a cost effective means to increase the bandwidth, e.g., for lines placed on the middle layers of PCB boards, especially large PCB boards having typical thicknesses of about 100-200 mil, or more. That is, in one embodiment, after plating the entire via hole, "backdrilling" may be performed to remove a portion of the plated through hole that may be detrimental to accurate high frequency measurements as contributing to a long stub portion. Performing backdrilling to remove a lengthy stub portion of the PTH connected to the trace line will increase the bandwidth of a high-frequency measurement using the SMA connector probe such as contemplated by the invention.

Alternate means of reducing the PTH stubs include use of stacks of subcomposites or microvia technologies. Subcomposites are groups of a few layers only that are built independently and then joined with short PTH vias. Other approaches would join these sub-groups with conducting material and not use drilling.

In the example multi-level PCB 199 shown in FIG. 14, capture pads or similar feature 225 are provided at layers 203 or 211 connected to a trace. During testing operation, in one example scenario, the probing for signal line at layer 203 is performed from test pad 117 at layer 213 making the via stub 221 short. On the right side of the PCB depicted in FIG. 14, the testing for signal line at layer 211 is performed from the test pad 119 on layer 201 making the via stub 216 short.

Further, as shown in FIG. 14, in every layer that PTH via traverses, there is a gap between it and the ground planes referred to as an "antipad". Metal material is only plated where the actual hole was drilled so that the via does not short to the ground but connects the outside test pad to the inner signal layer. An example signal path for testing, in one embodiment, starts from a test pad, e.g., 119 on the right side of the PCB 199, down through the PTH via to the layer of interest, e.g., layer 211, propagate through the signal line at layer 211 on the left side of the PCB 199, propagate through the PTH on the right and reach a second surface test pad, e.g., test pad 119 on the top left side of the PCB 199. A line on PCB layer xx will be probed on the left and on the right, for input and output, from the same side of the board, either from layer 201 on both ends, or, from layer 213 on both ends of the line.

In alternate embodiment, for lines closer to the top or bottom layers of the PCB, e.g., within 40 mils from the PCB surface, probing is performed such that the stub length is minimal. Thus, for example, in a 10-layer PCB board, for lines in layers 201-203, probing can be done at test pads from the backside of the board, while for layers 211-213, probing is performed from the front of the board.

It is understood that, a similar PTH via connection is formed to connect a capacitor structure formed in the test coupon and embedded at a layer of the multi-level PCB to a surface test pad connection structure for connection to an RF connector device when making a capacitive test measurement, e.g., using an LCR multi-frequency meter (e.g., HP model 4275A).

Compensation of the PTH stub capacitance can also be made by enlarging the antipad size, further optimizing the launch structure and valid bandwidth of the resulting measurement. The optimal dimension can be determined by performing three dimensional modeling of the structure and simulating the entire measurement flow in a virtual test bench as will be described in greater detail herein below. The physical structure is modeled with a field solver.

The equivalent model is then included in SPICE type circuit simulation and virtual short pulse is injected into the two lines with these modeled via ends. The resultant pulses are then used in the signal processing software as if they were measured on actual hardware. The attenuation and phase are then extracted and the bandwidth is determined in a virtual mode.

Figure 15:
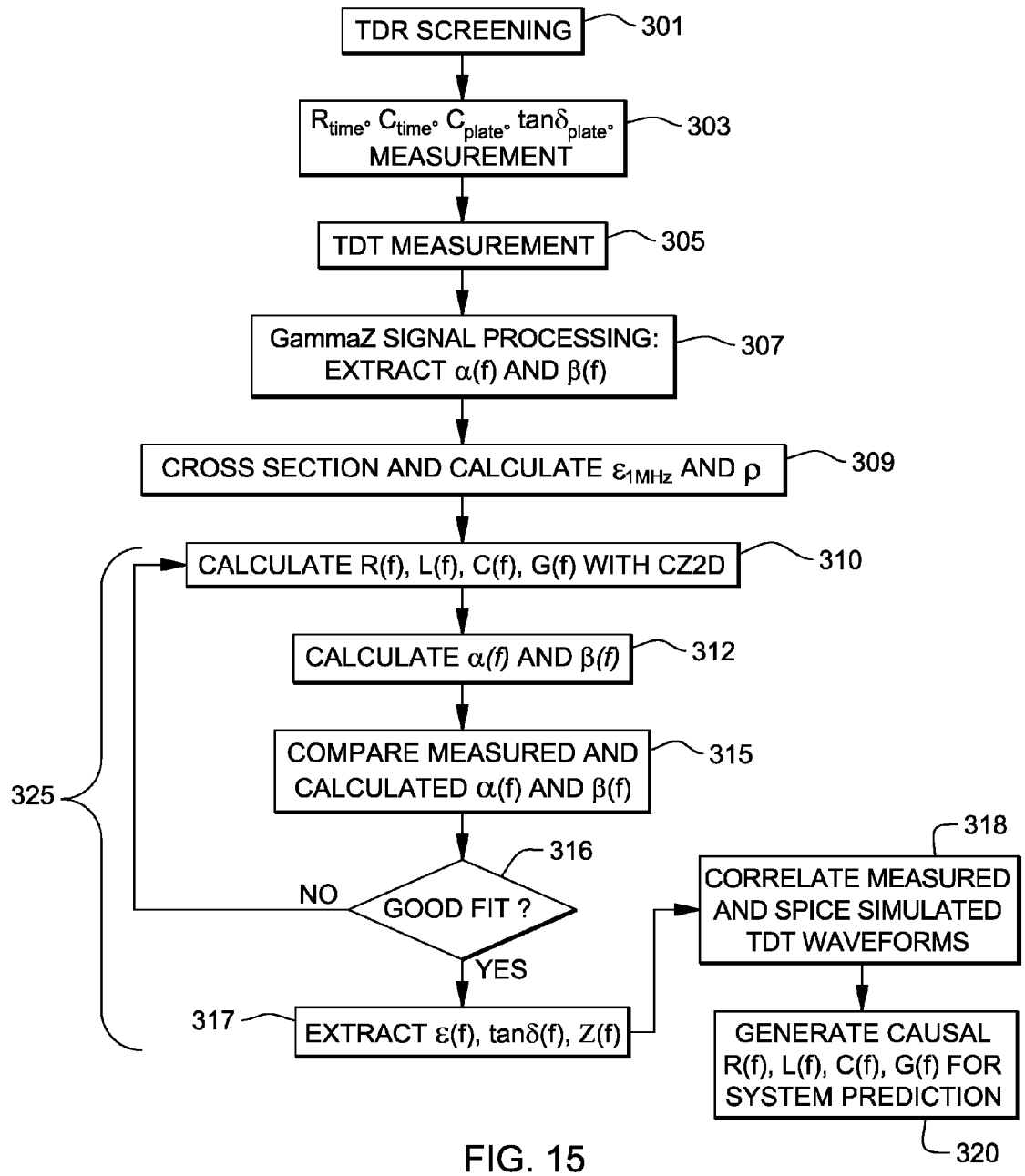
FIG. 15 depicts a methodology 300 for conducting the short-pulse-propagation, SPP, time-domain technique using the test apparatus of FIG. 14 in accordance with the invention; and, FIG. 16 shows a virtual test bench technique 400 that may be used to quantify the performance of a device, evaluate and virtually reconstruct SPP process, and define the allowable fabrication tolerances in production; and, FIG. 17 shows a cross-sectional view of a modeled virtual lossy stripline 410 of FIG. 16.

FIG. 15 depicts a methodology 300 for conducting the short-pulse-propagation, SPP, time-domain technique employing the test coupon structure of FIG. 9 on a product-level printed-circuit board such as shown in FIGS. 12, 13. A test apparatus configured as depicted in FIGS. 12 and 13, at a minimum, produces a short, electrical pulse propagating along the two identical transmission lines 102, 104 with different lengths, $l_1$ and $l_2$ at a test coupon provided at any level of the multi-level PCB. The SPP technique is used for both modeling and measurement of representative printed-circuit interconnect characteristics and their relevance for overall system performance. At a base level, the testing may be performed at the 3 cm and 10 cm traces of the test coupon of FIG. 8 to garner information useful for calculating the transmission line attenuation and phase along the copper trace. By including the other structures in the test coupon of FIG. 9, e.g., capacitor plate 120, additional information, such as the dielectric complex permittivity, can be extracted in the production environment and the user may incorporate other tests to provide more comprehensive information, e.g., that can be used for high frequency performance modeling.

As shown at step 301, in FIG. 15, using the line traces in the test coupon structure at any PCB layer, the test method employing the computer or processor device 500 (FIG. 13) implementing first programmed instructions for measuring the conductor's characteristic impedance Zo (not the broadband Zo(f) using a TDR (Time Domain Reffectometry) measurement. This initial screening enables selection of the two lines $l_1$ and $l_2$ that have similar Zo. The simple, single-frequency Zo testing of the prior art, is enhanced with the technique of the invention as it is now possible to perform attenuation measurement and ultimately extract the full broadband propagation constant Γ(f) and Zo(f) over the desired frequency range.

Thus, at step 303, a DC measurement is performed to obtain line resistance in accordance with equation (2), and line capacitance at 1 MHz, and plate capacitance and dielectric loss measurements are made in accordance with equations (3) and (5).

Figure 1:
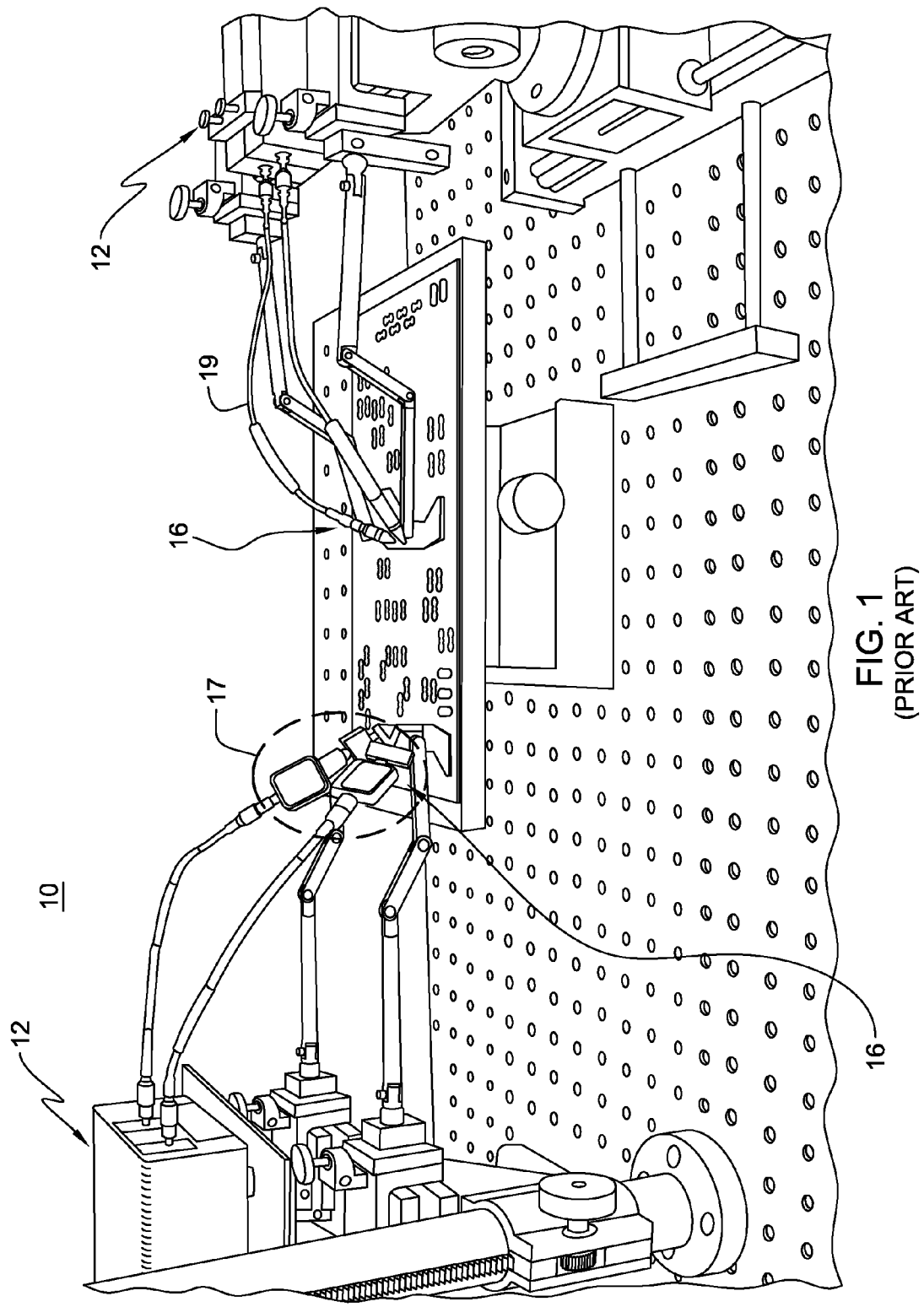
FIG. 1 is a prior art depiction of a bench test set-up 10 for providing and measuring short pulses propagated on transmission line structures in an example application of an SPP technique.
Figure 2:
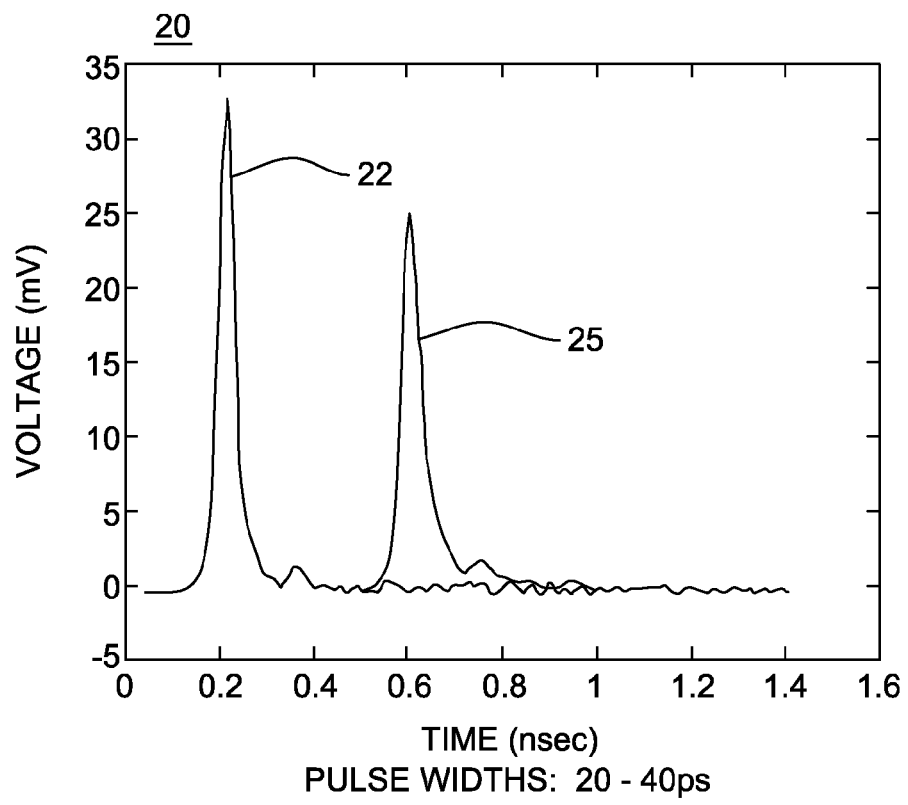
FIG. 2 is a plot 20 depicting two short pulses propagated on the transmission lines in an example application of the SPP technique utilizing the production-level test set-up of FIGS. 13A, 13B in one embodiment of the invention.

A time domain transmission (TDT) step 305, in FIG. 15, is then performed in order to obtain the two propagated pulses as shown in FIG. 2 implemented in the SPP technique. FIG. 2 is a plot 20 depicting two short pulses 22, 25 propagated on 2 cm and 8 cm long transmission lines respectively, in a current example application of the SPP technique utilizing the measurement apparatus 150 of FIGS. 12,13.

In step 307, the test equipment is configured to perform GammaZ signal processing of the propagated pulses to obtain the complex propagation constant $\Gamma(f)$ as set forth in equation (1). This then allows the extraction of the complex permittivity, however, requires test line cross sectioning. At step 309, the signal lines and parallel plate are cross sectioned at several locations and average dimensions are obtained to perform an initial calculation of the complex permittivity, e.g., at 1 MHz.

Continuing in accordance with the invention, the measurements may be extended to their full capability for extracting the full material properties of the insulator being used in the PCB. That is, while the SPP technique can be completed to the stage of extracting both the propagation constant and broadband impedance, the invention further allows the extraction of the complex permittivity. Such a step requires test line cross sectioning, calculation of R, L, C, G parameters with a field solver, measurement of the large plate loss tangent and capacitance at low frequency, and comparing of measured attenuation and phase to calculated values in an iterative manner as shown at step 325.

Thus, continuing at step 310, FIG. 15, there is performed the calculation of R(f), L(f), C(f), and G(f) parameters using a causally-enforced field solver, CZ2D such as described in the reference to W. T. Weeks entitled "Calculation of coefficients of capacitance of multiconductor transmission lines in the presence of dielectric interface", IEEE Trans. Mirowave Theory Tech., vol. MTT-18, pp. 35-43, 1970, and implementing the Debye model from equation (4). This leads to calculating the total attenuation $\alpha(f)$ and $\beta(f)$ at step 312 to extract the broadband complex permittivity in accordance with equation (5) and the characteristic impedance accordance with equation(6). It is understood that the C(f) and G(f) are calculated with CZ2D solver by using an initial set of values for the loss tangent of the dielectric, i.e., tan $\delta$, using the permittivity value measured at 1 MHz as conducted at step 309, FIG. 15. Then at step 315, the $\alpha(f)$ and $\beta(f)$ complex propagation parameters extracted at step 307 are compared to the $\alpha(f)$ and $\beta(f)$ values as calculated at step 312.

Figure 3:
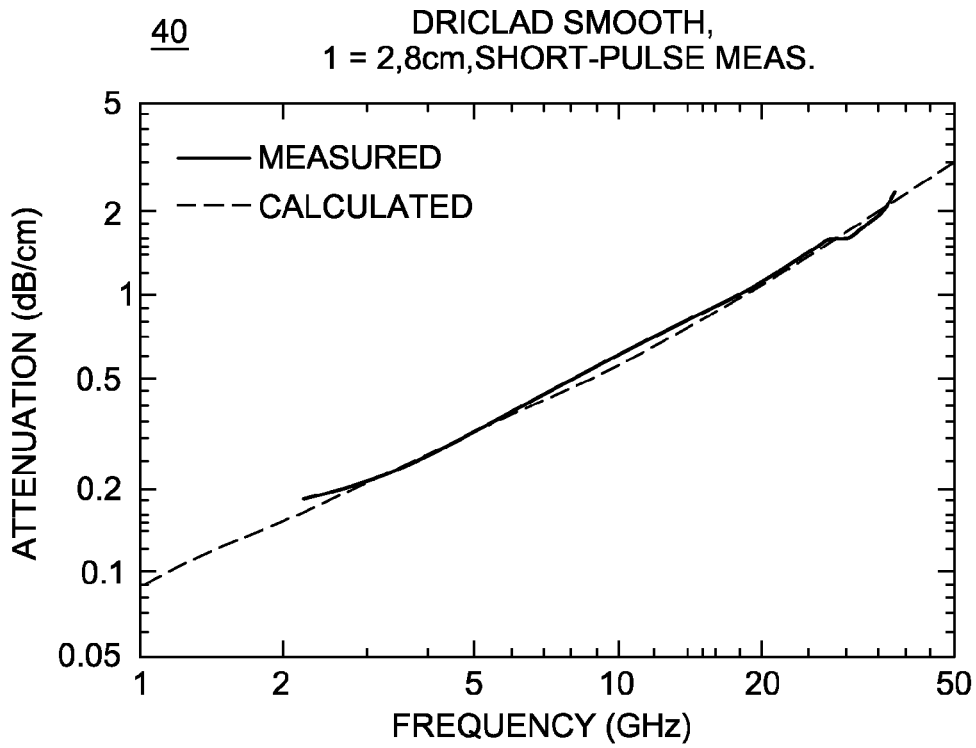
FIG. 3 is an example plot depicting an example measured and fitted attenuation (dB/cm) up to 50 GHz for an example PCB transmission line structure using the production-level test set-up of FIGS. 13A, 13B in one embodiment of the invention.
Figure 4:
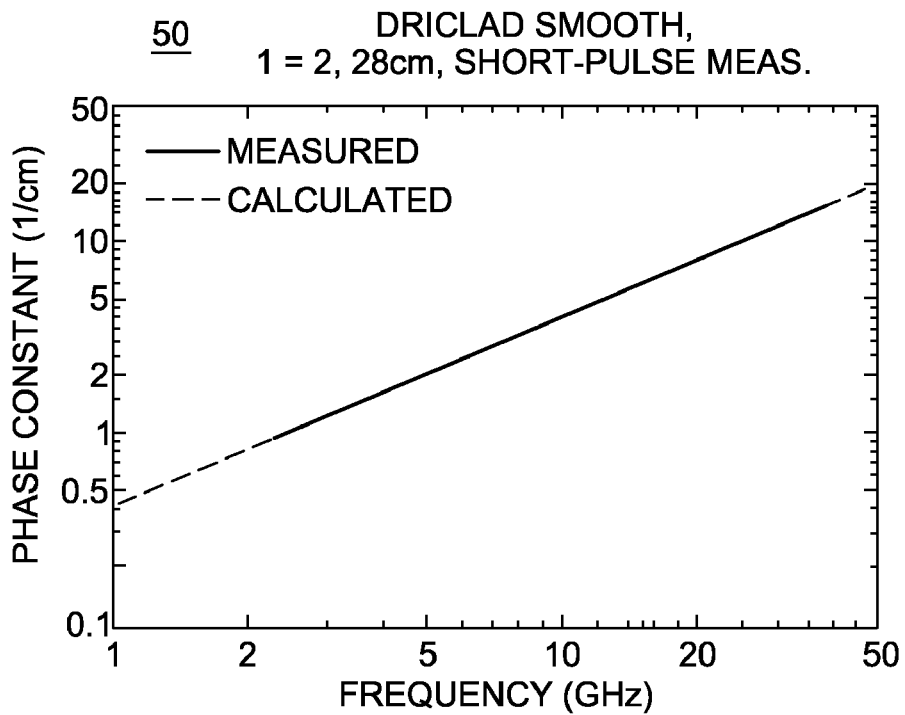
FIG. 4 is an example plot depicting an example fitted and measured phase constant (1/cm) up to 50 GHz for an example PCB transmission line structure using the production-level test set-up of FIGS. 13A, 13B in one embodiment of the invention.

FIG. 3 is an example plot 40 depicting an example measured and fitted attenuation (dB/cm) as a function of frequency (up to 50 GHz) for an example PCB transmission line structure using the automated production-level test set-up of FIGS. 12 and 13; and, FIG. 4 is an example plot 50 depicting an example fitted and measured phase constant (1/cm) as a function of frequency (up to 50 GHz) for an example PCB transmission line structure using the production-level test set-up of FIGS. 12 and 13.

Continuing, at step 316, a determination is made as to whether the calculated values are acceptable, i.e., a good fit. If the calculated values are not a good fit, the process returns to step 310 to perform the calculation of R, L, C, G parameters with a field solver, and with adjusted parameters of the expansion (e.g., $\in_i \in_\infty$ and $\tau_i$) to improve the fit. Thus, as shown in FIG. 15, step 325 is understood that a few iterations may be made to fit the $\alpha(f)$ and $\beta(f)$ complex propagation parameters to the measured values with each iteration adjusting the parameters of the expansion to improve the fit. In this iterative manner, a smooth interpolation and extrapolation is made over the desired frequency range (at step 320).

Figure 5:
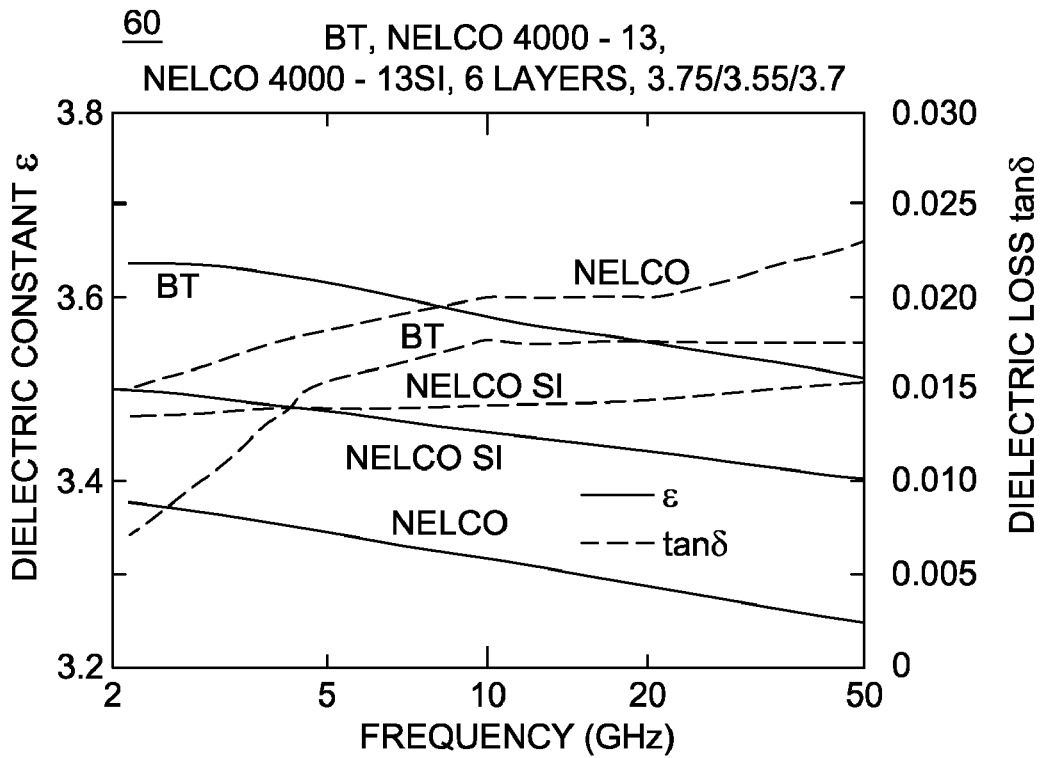
FIG. 5 is an example plot depicting the extracted broadband permittivity $\in(\omega)$ up to 50 GHz for the example PCB transmission line structure using the production-level test set-up of FIGS. 13A, 13B in one embodiment of the invention.
Figure 6:
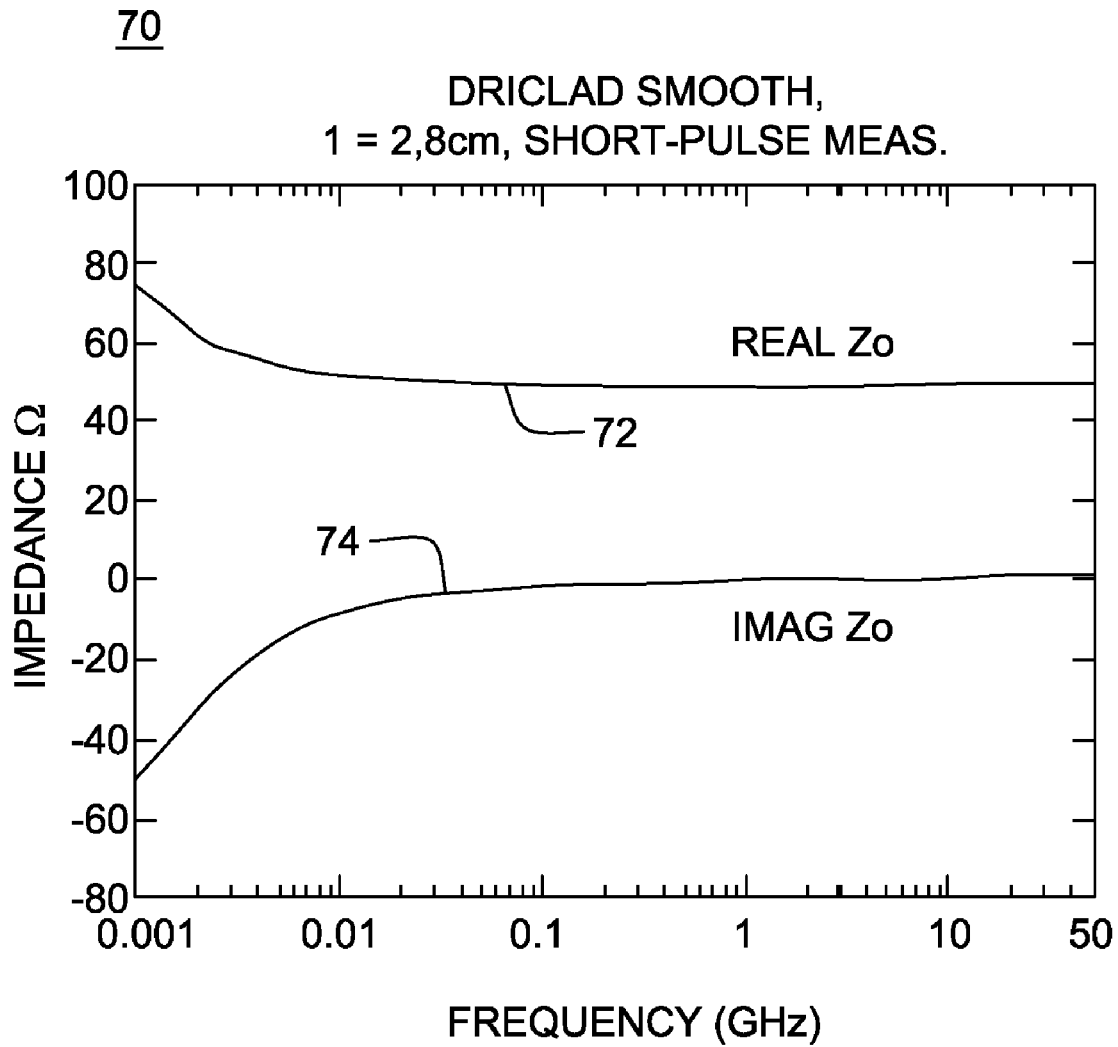
FIG. 6 is an example plot depicting an example extracted broadband characteristic impedance (Ohms) as a function of frequency showing both real and imaginary components in an example implementation of the SPP measurement techniques employed in the production-level test set-up of FIGS. 13A, 13B.
Figure 7A:
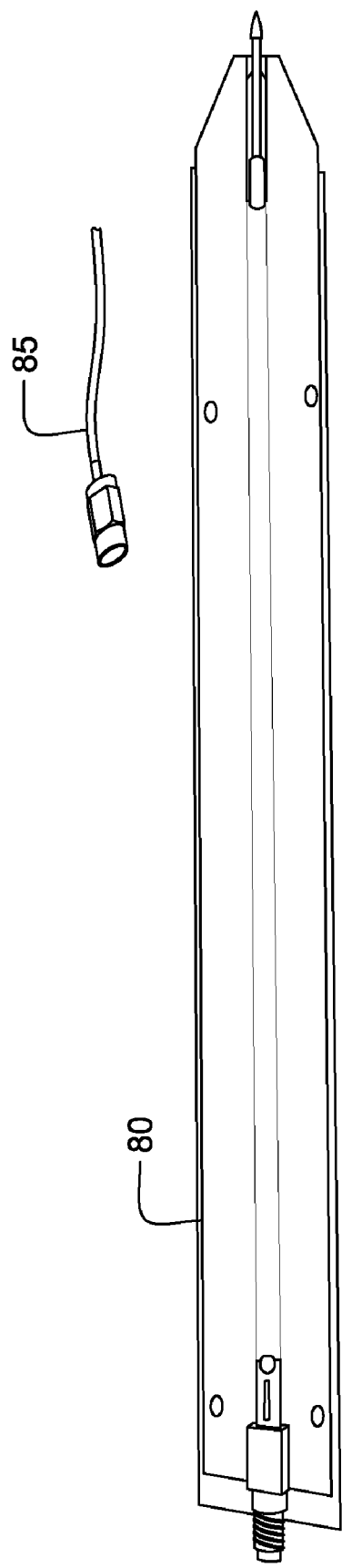
FIG. 7A depicts a 100 mil pitch bandheld coaxial probe; and, FIG. 7B depicts a close up view of the 100 mil pitch tips used for high-speed measurements in accordance with the prior art.
Figure 7B:
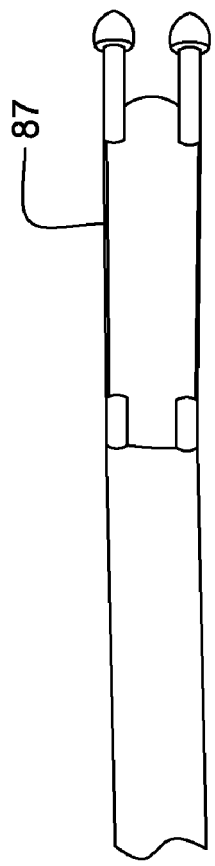

Remaining steps 325 are performed to obtain the full model in step 320, including the step 317 of extracting the complex permittivity, loss tangent, and characteristic impedance over the desired frequency range, e.g., by relying upon equations (5) and (6) and also as explained in the herein incorporated reference to A. Deutsch, et al. entitled, "Extraction of $\in_r(f)$ and tan $\delta(f)$ for Printed Circuit Board Insulators Up to 30 GHz Using the Short-Pulse Propagation Technique", IEEE Transactions on Advanced packaging, vol. 28, no. 1, pp. 4-12, February 2005. The extracted R(f), L(f), C(f), and G(f) are input to a Spice type circuit simulator to predict pulse and step signal propagation. These simulated waveforms are compared to actual measured TDT signals and step 318 in FIG. 15 completes the correlation process. Since the R(f), L(f), C(f), and G(f) are produced by a field solver that enforces causality and the resultant waveforms are verified with actual measurements, the transmission line models produced by the complete procedure in FIG. 15 become reliable, predictive models for system performance prediction. For example, FIG. 5 is an example plot 60 depicting the extracted broadband permittivity $\in(\omega)$ as a function of frequency (up to 50 GHz) and FIG. 6 is an example plot 70 depicting an example extracted broadband characteristic impedance (Ohms) as a function of frequency (up to 50 GHz) and showing both real 72 and imaginary 74 components for the example PCB transmission line structure using the production-level test set-up of FIGS. 12, 13. The extracted broadband characteristic impedance value is unlike the simple, single value $Z_o$ obtained with typical time-domain reflectometry, TDR, measurements.

The SPP time-domain technique can successfully be used to extract the broadband permittivity for typical packaging interconnects. The technique is typically used on representative stripline structures built with small interface discontinuities such as pads and vias. A short pulse is injected into the two lines of different lengths. Signal processing of the digitized pulses consists of rectangular time windowing of the unwanted reflections from interface discontinuities and Fourier transformation. From the ratio of the two Fourier transforms the total attenuation $\alpha(f)$ and phase constant $\beta(f)$ are obtained as shown at step 307, FIG. 15.

In sum, the SPP technique as described above can be completed to the stage of extracting both the propagation constant and broadband impedance. This then allows the extraction of the complex permittivity. Such a step requires test line cross sectioning, calculation of R, L, C, G parameters with a field solver, measurement of the large plate loss tangent and capacitance at low frequency, and comparing of measured attenuation and phase to calculated values in an iterative manner as shown at step 325. These steps could be done only on small number of board locations for spot checking of the material characteristics when a new vendor is selected or can be measured on smaller cards with fewer layers. The smaller card would be used in pre-physical build stage to evaluate the performance of the best material for the target system operation.

Such smaller cards could be measured with coaxial probes or with the SMA probes and set-up shown in FIGS. 12 and 13 where the bandwidth could be typically extended to 50 GHz.

Figure 16:
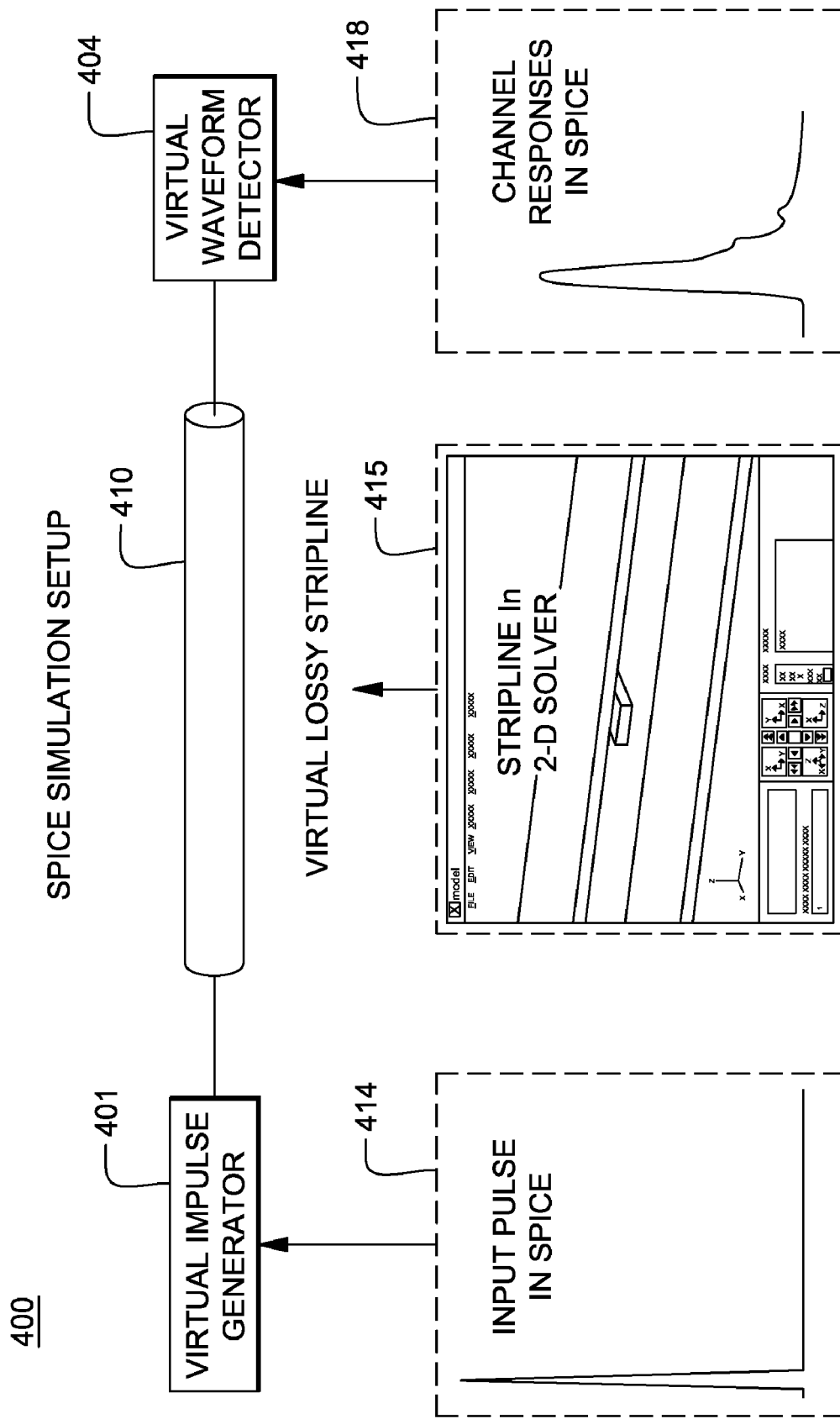
Figure 17:
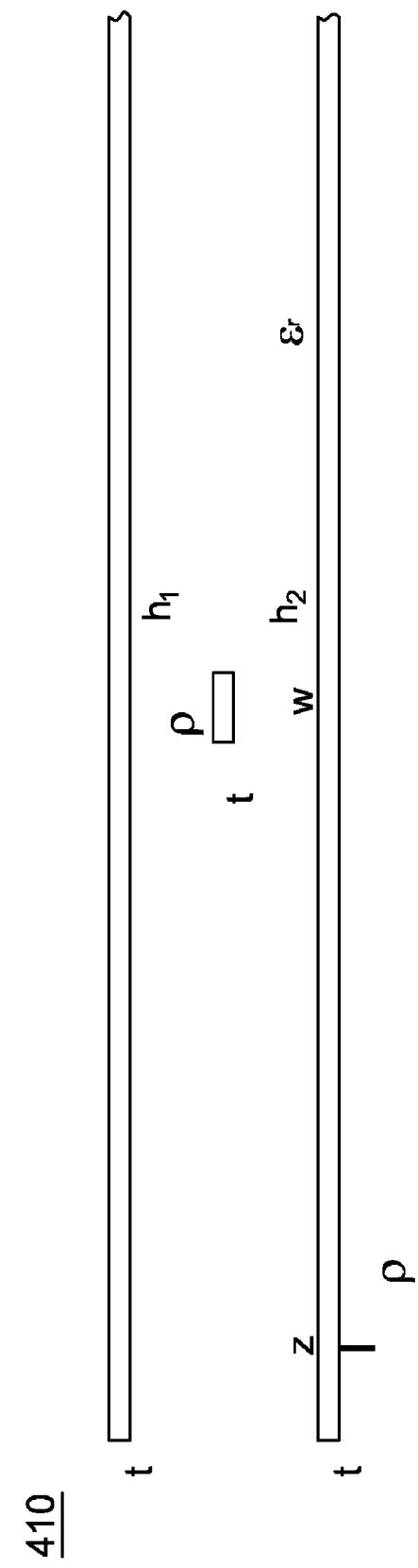

FIG. 16 shows a virtual test bench technique 400 that may be used to quantify the performance of a device to the circuit parameter variation, evaluate and virtually reconstruct SPP process, and define the allowable fabrication tolerances in production. As shown in FIG. 16, the virtual test bench includes a SPICE simulation technique implementing a programmed computer configured, in one embodiment, as a Virtual Impulse Generator 401 and virtual waveform detector 404, for simulating inputs pulses 414 and detecting corresponding virtual output pulses 418 of a virtual lossy stripline 410 modeled according to the SPP technique of the invention in the CZ2D solver 415. That is, the 2-D solver 415 is used to simulate the stripline to obtain line parameter R, L, C, and C as well as α(f). However, the line impedance are affected by the $h_1$(mil), $h_2$(mil), w (mil), t(mil), ρ(ηΩ.cm), $\in_r$, $Z_0$(Ω) parameters as shown in the cross-sectional view of the modeled virtual lossy stripline 410 shown in FIG. 17. For example, it is seen that $Z_0$ variation impacts the SPP predicted α(f). The difference "Δ" between 2-D solver and SPP is defined equation (7):

$$\Delta = \frac{\alpha(CZ2D) - \alpha(SPP)}{\alpha(CZ2D)}\% \quad (7)$$

Simulations with the virtual test bench technique were made of the effect of process tolerances on the accuracy of the SPP technique. It was found that the technique is able to discern even +/−1.6% changes in characteristics of the transmission lines.

The emulated simulation indicates that TDR screening needs to be done prior to the short-pulse excitation. The SPP technique should not be used with lines having more than +/−10% non-uniformity in impedance along the length. In addition, the two lines used, should not differ in $Z_0$ by more than 5% in order to obtain the SPP predicted attenuation error to be under 10% and this is why step 301 of line screening is needed.

The emulation technique can also be used to verifying the accuracy and capability of measurement techniques and so it is of general applicability. The measurement technique described here can also be used to discern effects such as roughness of metallization (see for example, the reference to Alina Deutsch, et al. entitled "Prediction of Losses Caused by Roughness of Metallization in Printed-Circuit Boards", IEEE Transactions on Advanced Packaging, Vol. 30, No. 2, May 2007, incorporated by reference herein), inhomogeneities in differential transmission line structures due to the fiber weave absence between the lines (see for example, the reference to Alina Deutsch, et al. entitled "Use of the SPP Technique to Account for Inhomogeneities in Differential Printed-Circuit-Board Wiring" Digest of SPI'08, Signal Propagation on Interconnects, May 12-15, 2008, Avignon, France, pp. 22-26, and incorporated by reference herein) and inhomogeneities in top or bottom microstrip structures that have soldermask layers on top of typical insulator layer. In such cases, a two step technique would be used whereby two sets of cards are built. In the first case a homogeneous card or a smooth card or a card without soldermask is built and measured. In the second step the measurement is repeated but on cards with these additional effects included. The technique can also be used to used whereby two sets of cards are built. In the first case a homogeneous card or a smooth card or a card without soldermask is built and measured. In the second step the measurement is repeated but on cards with these additional effects included. The technique can also be used to fully characterize other transmission line structures used in computer systems, such as cables, chip carrier wiring, and on-chip interconnects.

SPP is used to generate broadband predictive models for differential lines with different glass-fiber-to-epoxy-resin ratios and also for the soldermask layers used on top and bottom of typical boards. In both cases, a two-step extraction procedure is employed to obtain the broadband complex permittivity for the inhomogeneous structures and correlation with TDT measurements is used to validate the technique.

The present invention can be realized as a combination of hardware and software. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which, when loaded into a computer system, is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus, the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to affect one or more functions of this invention. Furthermore, the present invention may be implemented as a program storage device readable by machine, tangibly embodying a program of instructions executable by the machine to perform method steps for causing one or more functions of this invention.

The system and method of the present disclosure may be implemented and run on a general-purpose computer or computer system. The computer system may be any type of known or will be known systems and may typically include a processor, memory device, a storage device, input/output devices, internal buses, and/or a communications interface for communicating with other computer systems in conjunction with communication hardware and software, etc.

Figure 18:
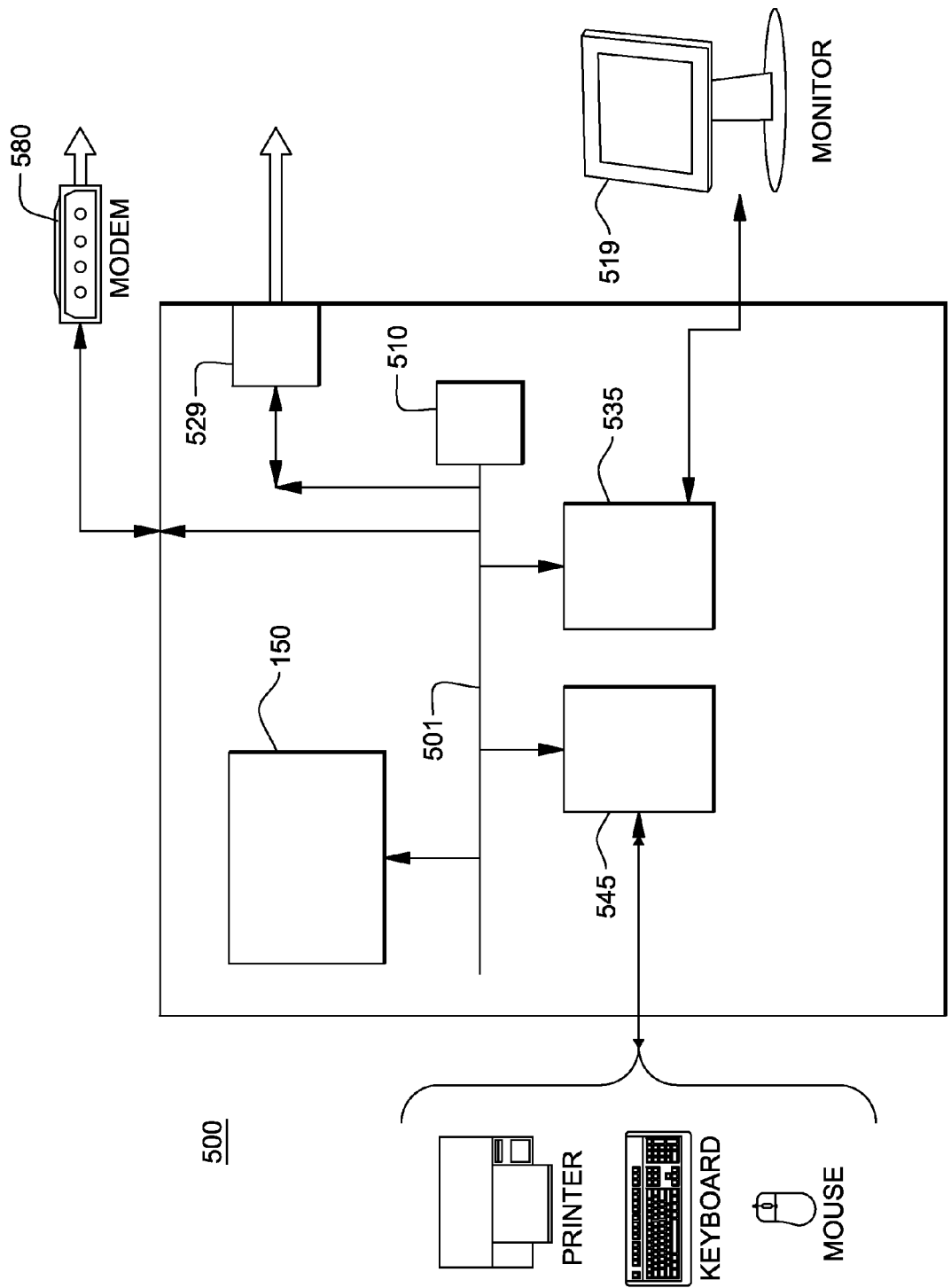
FIG. 18 depicts and exemplary computer system 500 including one or more processors or processing units, a system memory, and an address/data bus structure that connects various system components together.

More specifically, as shown in FIG. 18, a computer system 500, includes one or more processors or processing units 510, a system memory 150, and an address/data bus structure 501 that connects various system components together. For instance, the bus 501 connects the processor 510 to the system memory 550. The bus 501 can be implemented using any kind of bus structure or combination of bus structures, including a memory bus or memory controller, a peripheral bus, an accelerated graphics port, and a processor or local bus using any of a variety of bus architectures such as ISA bus, an Enhanced ISA (EISA) bus, and a Peripheral Component Interconnects (PCI) bus or like bus device Additionally, the computer system 500 includes one or more monitors 519 and, operator input devices such as a keyboard, and a pointing device (e.g., a "mouse") for entering commands and information into computer, data storage devices, and implements an operating system such as Linux, various Unix, Macintosh, MS Windows OS, or others.

The computing system 500 additionally includes: computer readable media, including a variety of types of volatile and non-volatile media, each of which can be removable or non-removable. For example, system memory 550 includes computer readable media in the form of volatile memory, such as random access memory (RAM), and non-volatile memory, such as read only memory (ROM). The ROM may include an input/output system (BIOS) that contains the basic routines that help to transfer information between elements within computer device 500, such as during start-up. The RAM component typically contains data and/or program modules in a form that can be quickly accessed by processing unit. Other kinds of computer storage media include a hard disk drive (not shown) for reading from and writing to a non-removable, non-volatile magnetic media, a magnetic disk drive for reading from and writing to a removable, non-volatile magnetic disk (e.g., a "floppy disk"), and an optical disk drive for reading from and/or writing to a removable, non-volatile optical disk such as a CD-ROM, DVD-ROM, or other optical media. Any hard disk drive, magnetic disk drive, and optical disk drive would be connected to the system bus 501 by one or more data media interfaces (not shown). Alternatively, the hard disk drive, magnetic disk drive, and optical disk drive can be connected to the system bus 501 by a SCSI interface (not shown), or other coupling mechanism. Although not shown, the computer 500 can include other types of computer readable media. Generally, the above-identified computer readable media provide non-volatile storage of computer readable instructions, data structures, program modules, and other data for use by computer 500. For instance, the readable media can store an operating system (O/S), one or more application programs, and/or other program modules and program data for enabling video editing operations via Graphical User Interface (GUI).

Input/output interfaces 545 are provided that couple the input devices to the processing unit 510. More generally, input devices can be coupled to the computer 500 through any kind of interface and bus structures, such as a parallel port, serial port, universal serial bus (USB) port, etc. The computer environment 500 also includes the display device 519 and a video adapter card 535 that couples the display device 519 to the bus 501. In addition to the display device 519, the computer environment 100 can include other output peripheral devices, such as speakers (not shown), a printer, etc. I/O interfaces 545 are used to couple these other output devices to the computer 500.

As mentioned, computer system 500 is adapted to operate in a networked environment using logical connections to one or more computers, such as the server device that may include all of the features discussed above with respect to computer device 500, or some subset thereof. It is understood that any type of network can be used to couple the computer system 500 with a server device, such as a local area network (LAN), or a wide area network (WAN) (such as the Internet). When implemented in a LAN networking environment, the computer 500 connects to local network via a network interface or adapter 529. When implemented in a WAN networking environment, the computer 500 connects to the WAN via a high speed cable/dsl modem 580 or some other connection means. The cable/dsl modem 180 can be located internal or external to computer 500, and can be connected to the bus 501 via the I/O interfaces 545 or other appropriate coupling mechanism. Although not illustrated, the computing environment 500 can provide wireless communication functionality for connecting computer 500 with remote computing device, e.g., an application server (e.g., via modulated radio signals, modulated infrared signals, etc.).

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and server. A module may be a component of a device, software, program, or system that implements some "functionality", which can be embodied as software, hardware, firmware, electronic circuitry, or etc.

In sum, the system and method of the present invention provides an automated or semi-automated technique for large volume testing of PCBs in a production level environment. In such environments, very thick boards are tested with very long plated through-hole (PTH) vias. Testing may be performed on many boards within short time by operators who are not familiar with advanced, delicate measurement technique.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

The invention claimed is:

1. A system for testing performance of a multi-level printed circuit board (PCB) having one or more layers of conductors carrying signals at or exceeding Gigahertz frequencies, the testing system comprising:

formed at a layer of said multi-level PCB board, a first conductor line of x length and a second conductor line of y length where x>y; and, each first and second conductor line having respective capture pad termination at each end;

a plated via through hole extending between a formed surface test pad connector at said top and bottom surfaces of said PCB for electrically coupling respective first and second capture pad terminations at each line end to a respective surface test pad connector provided at a top and bottom PCB surface, each test pad connector configured for electrical coupling to an RF connector device at said PCB board surface; and, a testing apparatus configured for testing said conductor line formed at a PCB layer by inputting signals at a first end of said conducting line via said RF connector device coupled to a first surface test pad connector at a PCB surface and measuring signals at a second end of said conducting line via a second RF connector device coupled to a second surface test pad connector at said PCB surface, said test apparatus processing said measured signals for modeling performance of said PCB when operating in excess of Gigahertz frequencies, said testing implementing a time-domain Short Pulse Propagation (SPP) technique.

2. The system as claimed in claim 1, further comprising: formed at a layer of said multi-level PCB board, a capacitor structure having a first a test pad structure formed at a layer being electrically coupled to each end of said capacitor plate structure and configured for electrical coupling to said RF connector device.

3. The system as claimed in claim 1, wherein the testing apparatus comprises:
first and second mounting devices rigidly holding first and second RF connector devices; and,
indexing means for automatically aligning said multi-level PCB to said first and second RF connector devices for enabling coupling of said RF connector devices to respective surface test pad structures.

4. The system as claimed in claim 1, wherein the testing apparatus comprises:
robotic manipulator including arms holding said first and second RF connector devices, said arms configured for automatic indexed movement to align said first and second RF connector devices to surface test pad structures of said multi-level PCB to enable coupling of said RF connector devices to said respective surface test pad structures.

5. The system as claimed in claim 1, wherein said surface test pad structures of said multi-level PCB comprises one or more mechanical alignment holes, each said RF connector device including a set of guide structures extending therefrom that can be fit in a corresponding said one or more mechanical alignment holes of said surface test pad structure for improved connection.

6. The system as claimed in claim 5, wherein said RF connector device is an SMA connector.

7. The system as claimed in claim 1, wherein said conductor line is a strip line or micro strip transmission line structure.

8. The system as claimed in claim 1, wherein a portion of said plated via through hole extending between a formed surface test pad connector at one of a top or bottom PCB surface and a conductor line capture pad at a signal line layer beneath the PCB surface includes a stub portion, wherein, during said testing, said RF connector devices coupled to a surface test pad connector that minimizes a length of said stub portion.

9. The system as claimed in claim 1, wherein said PCB is a production-level PCB, said test apparatus processing said measured signals for extracting a broadband propagation constant and characteristic impedance of said conductor line structures useful for said performance modeling.

10. The system as claimed in claim 1, wherein said test apparatus processes said measured signals for extracting a broadband attenuation and phase constant of said conductor line structures useful for said performance modeling.

11. A test structure provided for facilitating performance testing of a multi-level printed circuit board (PCB) having one or more layers of conductors carrying signals at or exceeding Gigahertz frequencies, the testing structure comprising:
a first conductor line formed at a layer of said multi-level PCB board, of x length and a second conductor line formed at a same layer of said multi-level PCB board, of y length where x>y; and, each first and second conductor line having respective capture pad termination at each end; and,
a plated via through hole extending between a formed surface test pad connector at a surface of said PCB for electrically coupling respective first and second capture pad terminations at each line end to a respective surface test pad connector provided at a PCB surface, each test pad connector configured for electrical coupling to an RF connector device at said PCB board surface,
wherein a test apparatus models performance of said PCB when operating in excess of Gigahertz frequencies by coupling signals to and from a conductor line via said RF connector device and automatically performing a time domain single pulse propagation measurement of said conductor lines at a PCB layer.

12. The test structure as claimed in claim 11, further comprising: formed at said same layer of said multi-level PCB board, a capacitor structure having corresponding surface test pad structure being electrically coupled to said capacitor structure through a respective plated via through hole and configured for electrical coupling to said RF connector device.

13. The test structure as claimed in claim 11, wherein said plated via through hole extends between front and back PCB surfaces, a test pad connector provided at both front and back PCB board surfaces.

14. The test structure as claimed in claim 11, wherein said first and second conducting lines are each formed at multiple layers of a PCB, each conductor line at each layer having a respectively formed PTH via connection to a respective test pad connector formed at a PCB surface.

15. The test structure as claimed in claim 13, wherein a portion of said plated via through hole extending between a formed surface test pad connector at one of a top or bottom PCB surface and a conductor line capture pad at a signal line layer beneath the PCB surface includes a stub portion, wherein, during said testing, said RF connector devices coupled to a surface test pad connector that minimizes a length of said stub portion.

16. A method of testing a multi-level printed circuit board (PCB) having one or more layers of conductors carrying signals at or exceeding Gigahertz frequencies, said method comprising:
providing, at a layer of said multi-level PCB board, a test structure comprising:
a first conductor line, of x length and a second conductor line formed at a same layer of y length where x>y; and, each first and second conductor line having respective capture pad termination at each end; and,
a plated via through hole extending between a formed surface test pad connector at a surface of said PCB for electrically coupling respective first and second capture pad terminations at each line end to a respective surface test pad connector provided at a PCB surface, each test pad connector configured for electrical coupling to an RF connector device at said PCB board surface,
automatically coupling a first RF connector device to a respective surface test pad connector via an RF connector device at a first end of a conductor line and a second RF connector device to a respective surface test pad connector at a second end a conductor line;
automatically configuring a testing apparatus for testing said conductor line formed at said layer by inputting signals at a first end of said conducting line via said first RF connector device coupled to a first surface test pad connector at a PCB surface and, measuring signals at a second end of said conducting line via said second RF connector device coupled to a second surface test pad connector at said PCB surface, said testing implementing a time-domain Short Pulse Propagation (SPP) technique; and,
processing, at a computing device, said measured signals for modeling broadband performance of said PCB when operating in excess of Gigahertz frequencies.

17. The method of testing as claimed in claim 16, wherein said testing apparatus comprises first and second mounting devices rigidly holding said first and second RF connector devices, a platform for engaging said multi-level PCB, and an indexing means carrying for automatically aligning said platform carrying said multi-level PCB with said first and second RF connector devices and automatically coupling said first and second RF connector devices to respective first and second surface test pad structures.

18. The method of testing as claimed in claim 16, wherein the testing apparatus comprises first and second robotic manipulator arms holding respective said first and second RF connector devices, said method further comprising:
  automatically coupling said first and second RF connector devices held by said robotic arms to respective surface test pad structures of said multi-level PCB.

19. The method of testing as claimed in claim 16, wherein a portion of said plated via through hole extending between a formed surface test pad connector at one of a top or bottom PCB surface and a conductor line capture pad at a signal line layer beneath the PCB surface includes a stub portion, said method further comprising:
  during said testing, coupling said RF connector devices to a surface test pad connector that minimizes a length of said stub portion.

20. The method of testing as claimed in claim 16, wherein said PCB is a production-level PCB, said processing performed at said computing device processing said measured signals for extracting a broadband propagation constant and characteristic impedance of said conductor line structures useful for said performance modeling.

21. The method of testing as claimed in claim 16, wherein said PCB is a production-level PCB, said processing performed at said computing device processing said measured signals for extracting a broadband attenuation and phase constant of said conductor line structures useful for said performance modeling.

22. The method of testing as claimed in claim 16, wherein said processing, at a computing device, further comprises:
  screening a conductor line of said test structure using a TDR technique.

23. The method of testing as claimed in claim 16, further comprising: emulating first or second conductor's measurement conditions using a virtual test bench.

24. The method of testing as claimed in claim 21, farther comprising: compensating the capacitive effect of a via stub portion to thereby extend bandwidth of the broadband PCB measurements.

25. The method of testing as claimed in claim 21, further comprising: modeling and simulating emulation of a broadband PCB measurement to evaluate sensitivity to process tolerances.

* * * * *